United States Patent
Lee et al.

(10) Patent No.: US 11,031,424 B2
(45) Date of Patent: Jun. 8, 2021

(54) IMAGE SENSOR WITH SELECTIVE LIGHT-SHIELDING FOR REFERENCE PIXELS

(71) Applicant: SAMSUNG ELECTRONICS CO., LTD., Suwon-si (KR)

(72) Inventors: Yun Ki Lee, Hwaseong-si (KR); Bumsuk Kim, Hwaseong-si (KR); Jonghoon Park, Seoul (KR); Junsung Park, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/400,094

(22) Filed: May 1, 2019

(65) Prior Publication Data

US 2020/0035729 A1  Jan. 30, 2020

(30) Foreign Application Priority Data

Jul. 25, 2018 (KR) ........................ 10-2018-0086453

(51) Int. Cl.
| | |
|---|---|
| *H01L 27/146* | (2006.01) |
| *H01L 31/05* | (2014.01) |
| *H04N 5/369* | (2011.01) |
| *H04N 5/378* | (2011.01) |
| *H01L 31/054* | (2014.01) |

(52) U.S. Cl.
CPC .... *H01L 27/14623* (2013.01); *H01L 27/1463* (2013.01); *H01L 27/14621* (2013.01); *H01L 27/14627* (2013.01); *H01L 27/14645* (2013.01); *H04N 5/3696* (2013.01); *H01L 31/0543* (2014.12); *H04N 5/378* (2013.01)

(58) Field of Classification Search
CPC ......... H01L 27/14623; H01L 27/14621; H01L 27/14627; H01L 27/1463; H01L 27/14645; H01L 31/0543; H04N 5/3696
See application file for complete search history.

(56) References Cited

U.S. PATENT DOCUMENTS

| | | | | |
|---|---|---|---|---|
| 6,060,732 A | * | 5/2000 | Murakami | ........ H01L 27/14818 257/215 |
| 6,081,018 A | * | 6/2000 | Nakashiba | ........ H01L 31/02162 257/232 |

(Continued)

FOREIGN PATENT DOCUMENTS

| | | | | |
|---|---|---|---|---|
| JP | 2006202778 A | * | 8/2006 | ....... H01L 27/14625 |
| JP | 2017-38311 A | | 2/2017 | |
| JP | 2017-188955 A | | 10/2017 | |

*Primary Examiner* — Ida M Soward
(74) *Attorney, Agent, or Firm* — Sughrue Mion, PLLC

(57) ABSTRACT

An image sensor includes a photoelectric conversion layer including a plurality of first photoelectric conversion elements and a plurality of second photoelectric conversion elements adjacent to the first photoelectric conversion elements. A light shield layer shields the second photoelectric conversion elements and has respective openings therein that provide light transmission to respective ones of the first photoelectric conversion elements. The image sensor further includes an array of micro-lenses on the photoelectric conversion layer, each of the micro-lenses overlapping at least one of the first photoelectric conversion elements and at least one of the second photoelectric conversion elements.

14 Claims, 26 Drawing Sheets

(56) References Cited

U.S. PATENT DOCUMENTS

| | | | |
|---|---|---|---|
| 7,719,040 B2* | 5/2010 | Nagasaki | H01L 27/14603 257/292 |
| 7,986,019 B2* | 7/2011 | Matsushita | H01L 27/14627 257/432 |
| 8,482,639 B2 | 7/2013 | Tai et al. | |
| 8,928,103 B2* | 1/2015 | Ohba | H01L 27/14623 257/432 |
| 9,159,760 B2* | 10/2015 | Ootsuka | H01L 27/14612 |
| 9,191,560 B2 | 11/2015 | Suzuki | |
| 9,224,782 B2 | 12/2015 | Keelan | |
| 9,349,762 B2 | 5/2016 | Cho et al. | |
| 9,479,745 B2 | 10/2016 | Lu et al. | |
| 9,947,700 B2* | 4/2018 | Yamazaki | H01L 27/14636 |
| 10,032,816 B2* | 7/2018 | Miyazawa | H01L 27/14618 |
| 10,044,918 B2* | 8/2018 | Masuda | H04N 5/359 |
| 10,115,756 B2* | 10/2018 | Hashimoto | H01L 27/14627 |
| 10,283,540 B2* | 5/2019 | Lee | H01L 27/1462 |
| 10,453,882 B2* | 10/2019 | Togashi | H01L 27/14605 |
| 10,615,298 B2* | 4/2020 | Manda | H04N 5/374 |
| 10,685,998 B2* | 6/2020 | Asatsuma | H01L 27/14621 |
| 10,756,130 B2* | 8/2020 | Miyazawa | H01L 27/14685 |
| 2001/0006237 A1* | 7/2001 | Abe | H01L 27/14627 257/215 |
| 2007/0097227 A1 | 5/2007 | Toyokawa | |
| 2010/0291730 A1* | 11/2010 | Uya | H01L 27/14603 438/73 |
| 2012/0147208 A1* | 6/2012 | Otsuka | H01L 27/14623 348/222.1 |
| 2013/0040415 A1* | 2/2013 | Arakawa | H01L 27/14685 438/68 |
| 2013/0181113 A1* | 7/2013 | Egawa | H01L 27/14627 250/208.1 |
| 2013/0256821 A1* | 10/2013 | Ohba | H01L 31/02016 257/432 |
| 2013/0334642 A1* | 12/2013 | Masuda | H01L 31/0232 257/432 |
| 2014/0362268 A1* | 12/2014 | Etoh | H04N 5/3696 348/306 |
| 2015/0035104 A1* | 2/2015 | Horikoshi | H01L 27/14623 257/432 |
| 2015/0076643 A1* | 3/2015 | Kikuchi | H01L 27/14685 257/432 |
| 2016/0093657 A1* | 3/2016 | Ryoki | H01L 27/14605 257/448 |
| 2016/0219232 A1 | 7/2016 | Murata | |
| 2016/0224816 A1 | 8/2016 | Smith et al. | |
| 2017/0003649 A1 | 1/2017 | Sinha | |
| 2017/0017824 A1 | 1/2017 | Smith et al. | |
| 2017/0083745 A1 | 3/2017 | Goodelle et al. | |
| 2017/0124370 A1 | 5/2017 | He et al. | |
| 2017/0161540 A1 | 6/2017 | Mienko et al. | |
| 2017/0161543 A1 | 6/2017 | Smith et al. | |
| 2017/0161544 A1 | 6/2017 | Fomani et al. | |
| 2017/0186805 A1* | 6/2017 | Lee | H01L 27/14627 |
| 2017/0214863 A1* | 7/2017 | Narabu | H04N 5/3415 |
| 2017/0220842 A1 | 8/2017 | Thompson et al. | |
| 2017/0220844 A1 | 8/2017 | Jones et al. | |
| 2017/0286742 A1 | 10/2017 | Mackey et al. | |
| 2018/0005005 A1 | 1/2018 | He et al. | |
| 2018/0025204 A1 | 1/2018 | Sam | |
| 2018/0081098 A1 | 3/2018 | Smith et al. | |
| 2018/0096186 A1 | 4/2018 | Mienko et al. | |
| 2018/0190707 A1* | 7/2018 | Lee | H01L 27/14645 |
| 2018/0301494 A1* | 10/2018 | Park | H01L 27/14629 |
| 2019/0081251 A1* | 3/2019 | Obana | H01L 51/0074 |
| 2020/0176499 A1* | 6/2020 | Park | H01L 27/14645 |
| 2020/0203412 A1* | 6/2020 | Shimotsusa | H01L 27/14685 |
| 2020/0227459 A1* | 7/2020 | Park | H01L 27/1463 |
| 2021/0029317 A1* | 1/2021 | Ando | H04N 5/232122 |

\* cited by examiner

IMAGE SENSOR WITH SELECTIVE LIGHT-SHIELDING FOR REFERENCE PIXELS

CROSS-REFERENCE TO RELATED APPLICATION

This U.S. nonprovisional application claims priority under 35 U.S.C § 119 to Korean Patent Application No. 10-2018-0086453 filed on Jul. 25, 2018 in the Korean Intellectual Property Office, the entire contents of which are hereby incorporated by reference.

BACKGROUND

The present inventive concepts relate to image sensors and, more particularly, to photoelectric image sensors with reference pixels.

An image sensor converts photonic images into electrical signals. Recent advances in computer and communication industries have led to strong demand for high performance image sensors in various consumer electronic devices, such as digital cameras, camcorders, PCSs (Personal Communication Systems), game devices, security cameras, and medical micro-cameras.

Image sensors may be classified into various types, including charged coupled devices (CCDs) and CMOS image sensors. CMOS image sensors typically have a relatively simple operating method, and size can be reduced because signal processing circuitry can be integrated into a single chip. CMOS image sensors typically have relatively low power consumption, which can be useful in battery-powered applications. Accordingly, the use of the CMOS image sensors has been rapidly increasing.

SUMMARY

Some example embodiments of the present inventive concepts provide an image sensor with improved electrical characteristics. Embodiments of the inventive concepts are not limited the embodiments described herein.

According to some example embodiments of the present inventive concepts, an image sensor includes a photoelectric conversion layer including a plurality of first photoelectric conversion elements and a plurality of second photoelectric conversion elements adjacent to the first photoelectric conversion elements. A light shield layer shields the second photoelectric conversion elements and has respective openings therein that provide light transmission to respective ones of the first photoelectric conversion elements. The image sensor further includes an array of micro-lenses on the photoelectric conversion layer, each of the micro-lenses overlapping at least one of the first photoelectric conversion elements and at least one of the second photoelectric conversion elements.

According to further example embodiments of the present inventive concepts, an image sensor includes a semiconductor substrate including a plurality of first photoelectric conversion elements and a plurality of second photoelectric conversion elements. The image sensor further includes a light shield layer on the semiconductor substrate and having respective ones of a plurality of openings that provide light to the first photoelectric conversion elements. The second photoelectric conversion elements are disposed between adjacent ones of the openings.

According to still further example embodiments of the present inventive concepts, an image sensor includes a pixel array including a plurality of unit pixels arranged in rows and columns, each of the unit pixels including at least one light-receiving pixel and at least one reference pixel. The image sensor further includes a light shield layer shielding the reference pixels and having respective openings therein that provide light to respective ones of the light-receiving pixels.

DETAILED DESCRIPTION OF EMBODIMENTS

The following will now describe in detail image sensors according to some example embodiments of the present inventive concepts in conjunction with the accompanying drawings.

Figure 1:
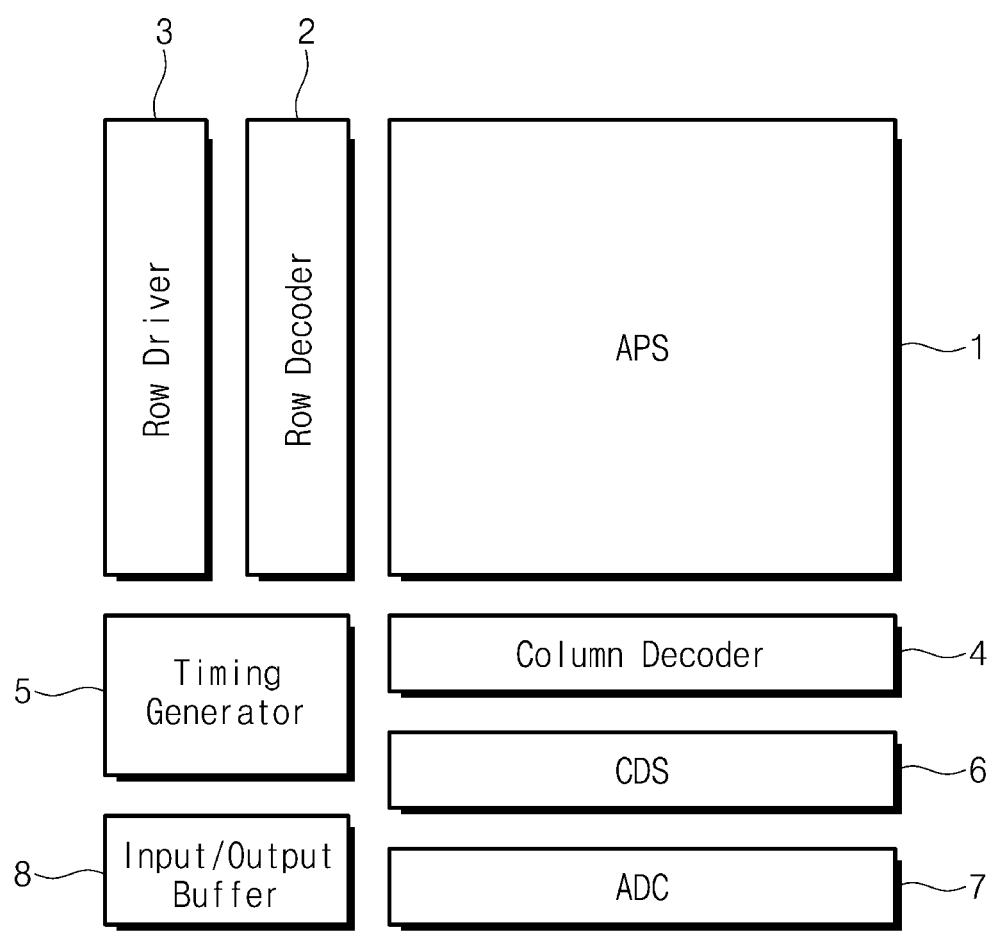
FIG. 1 illustrates a schematic block diagram showing an image sensor according to some example embodiments of the present inventive concepts.

FIG. 1 illustrates a schematic block diagram showing an image sensor according to some example embodiments of the present inventive concepts.

Referring to FIG. 1, an image sensor may include an active pixel sensor array (APS) 1, a row decoder 2, a row driver 3, a column decoder 4, a timing generator 5, a correlated double sampler (CDS) 6, an analog-to-digital converter (ADC) 7, and an input/output buffer 8.

The active pixel sensor array 1 may include a plurality of two-dimensionally arranged unit pixels, each of which is configured to convert optical signals into electrical signals. The active pixel sensor array 1 may be driven by a plurality of driving signals such as a pixel selection signal, a reset signal, and a charge transfer signal from the row driver 3. The converted electrical signals may be provided for the correlated double sampler 6.

The row driver 3 may provide the active pixel sensor array 1 with several driving signals for driving several unit pixels in accordance with a decoded result obtained from the row decoder 2. In case that the unit pixels are arranged in a matrix shape, the driving signals may be provided for respective rows.

The timing generator 5 may provide the row and column decoders 2 and 4 with timing and control signals.

The correlated double sampler (CDS) 6 may receive the electrical signals generated in the active pixel sensor array 1, and hold and sample the received electrical signals. The correlated double sampler 6 may perform a double sampling operation to sample a specific noise level and a signal level of the electrical signal, and then output a difference level corresponding to a difference between the noise and signal levels.

The analog-to-digital converter (ADC) 7 may convert analog signals, which correspond to the difference level received from the correlated double sampler 6, into digital signals and then output the converted digital signals.

The input/output buffer 8 may latch the digital signals and then sequentially output the latched digital signals to an image signal processing unit (not shown) in response to the decoded result obtained from the column decoder 4.

Figure 2:
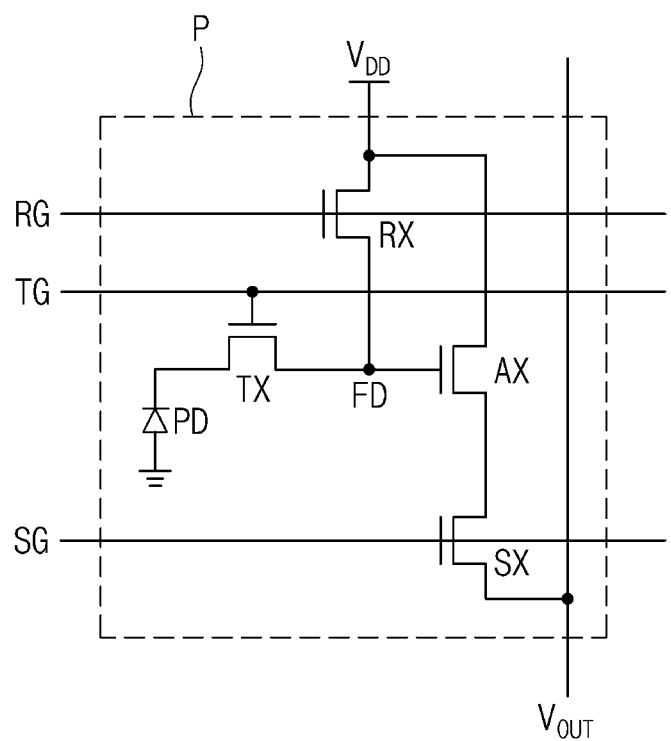
FIG. 2 illustrates a circuit diagram showing a pixel array of an image sensor according to some example embodiments of the present inventive concepts.

FIG. 2 illustrates a circuit diagram showing a pixel array of an image sensor according to some example embodiments of the present inventive concepts.

Referring to FIG. 2, a unit pixel P may include a transfer transistor TX and logic transistors RX, SX, and DX. The logic transistors RX, SX and AX may include a reset transistor RX, a selection transistor SX, and a source follower transistor AX or an amplifier transistor.

The transfer transistor TX may include a transfer gate electrode TG, a photoelectric conversion element PD, and a charge storage node FD (or a floating diffusion region).

The photoelectric conversion element PD may create and accumulate photo-charges in proportion to amount of externally incident light. In certain embodiment, the photoelectric conversion element PD may be one of a photo diode, a photo transistor, a photo gate, a pinned photo diode (PPD), and any combination thereof.

The transfer transistor TX may transfer charges accumulated in the photoelectric conversion element FD to the charge storage node FD. The transfer transistor TX may be controlled by a charge transfer signal provided through a charge transfer line TG.

The charge storage node FD may receive and accumulatively store charges generated from the photoelectric conversion element PD, and a gate electrode of the source follower transistor AX may change its electrical potential in accordance with amount of photo-charges accumulated in the charge storage node FD.

The reset transistor RX may periodically reset the charges accumulated in the charge storage node FD. For example, a gate electrode of the reset transistor RX may be connected to a reset signal line RG to which a reset signal is provided. A drain of the reset transistor RX may be connected to the charge storage node FD, and a source of the reset transistor RX may be connected to a power voltage $V_{DD}$. When the reset transistor RX is turned on by the reset signal, the charge storage node FD may receive the power voltage $V_{DD}$ connected to the source of the reset transistor RX. Accordingly, when the reset transistor RX is turned on, the photo-charges accumulated in the charge storage node FD may be drained and then the charge storage node FD may be reset.

The source follower transistor AX may amplify a variation in electrical potential of the charge storage node FD, and may output the amplified or pixel signal through the selection transistor SX to an output line $V_{OUT}$. The source follower transistor AX may be a source follower buffer amplifier that is configured to generate a source-drain current in proportion to amount of photo-charges applied to a gate electrode. The source follower transistor AX may include a gate electrode connected to the charge storage node FD, a drain connected to the power voltage $V_{DD}$, and a source connected to a drain of the selection transistor SX.

The selection transistor SX may select a row of unit pixels to be read out. A gate electrode of the selection transistor SX may be connected to a selection line SG through which a selection signal is provided. When the selection transistor SX is turned on by the selection signal, the output line $V_{OUT}$ may output a pixel signal that is output from the source of the source follower transistor AX.

FIG. 2 shows an example in which the unit pixel P consists of four transistor structures, but the unit pixel P may include three or five transistor structures, five transistor structures, or a photo gate structure similar to the four transistor structures.

Figure 3:
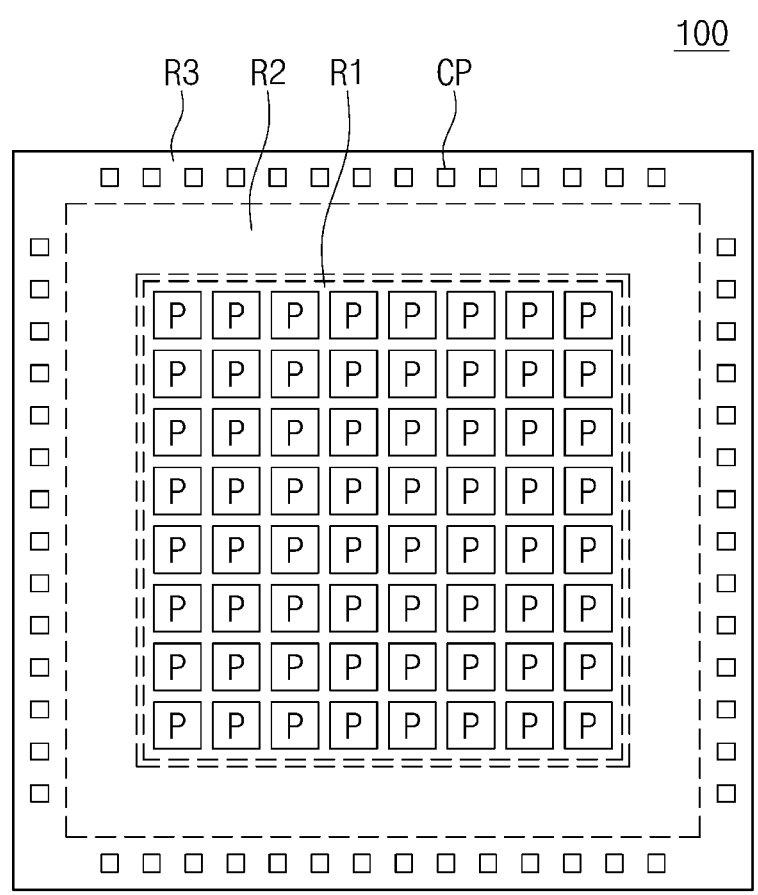
FIG. 3 illustrates a simplified plan view showing an image sensor according to some example embodiments of the present inventive concepts.

FIG. 3 illustrates a plan view showing an image sensor according to some example embodiments of the present inventive concepts.

Referring to FIG. 3, an image sensor may include a pixel array region R1, a control circuit region R2, and a pad region R3.

The pixel array region R1 may include a plurality of unit pixels P that are two-dimensionally arranged along rows and columns. The unit pixels P of the pixel array region R1 may output electrical signals converted from incident light.

In certain embodiments, the unit pixels P may include sensing pixels and reference pixels. The sensing pixels may convert incident light into electrical signals. The reference pixels may output electrical signals generated from unit pixels P onto which no or little light is incident.

The control circuit region R2 may be disposed around the pixel array region R1, and may include control circuits (not shown) to control the unit pixels P of the pixel array region R1. For example, the control circuit region R2 may include control circuits such as the row decoder 2, the row driver 3, the column decoder 4, the timing generator 5, the correlated double sampler 6, the analog-to-digital converter 7, and the input/output buffer 8 that are discussed with reference to FIG. 1.

The pad region R3 may include a plurality of conductive pads CP used for input and output of control signals and photoelectric conversion signals. The pad region R3 may be disposed at an edge portion of the image sensor, and may thus easily have electrical connection with external devices.

Figure 4:
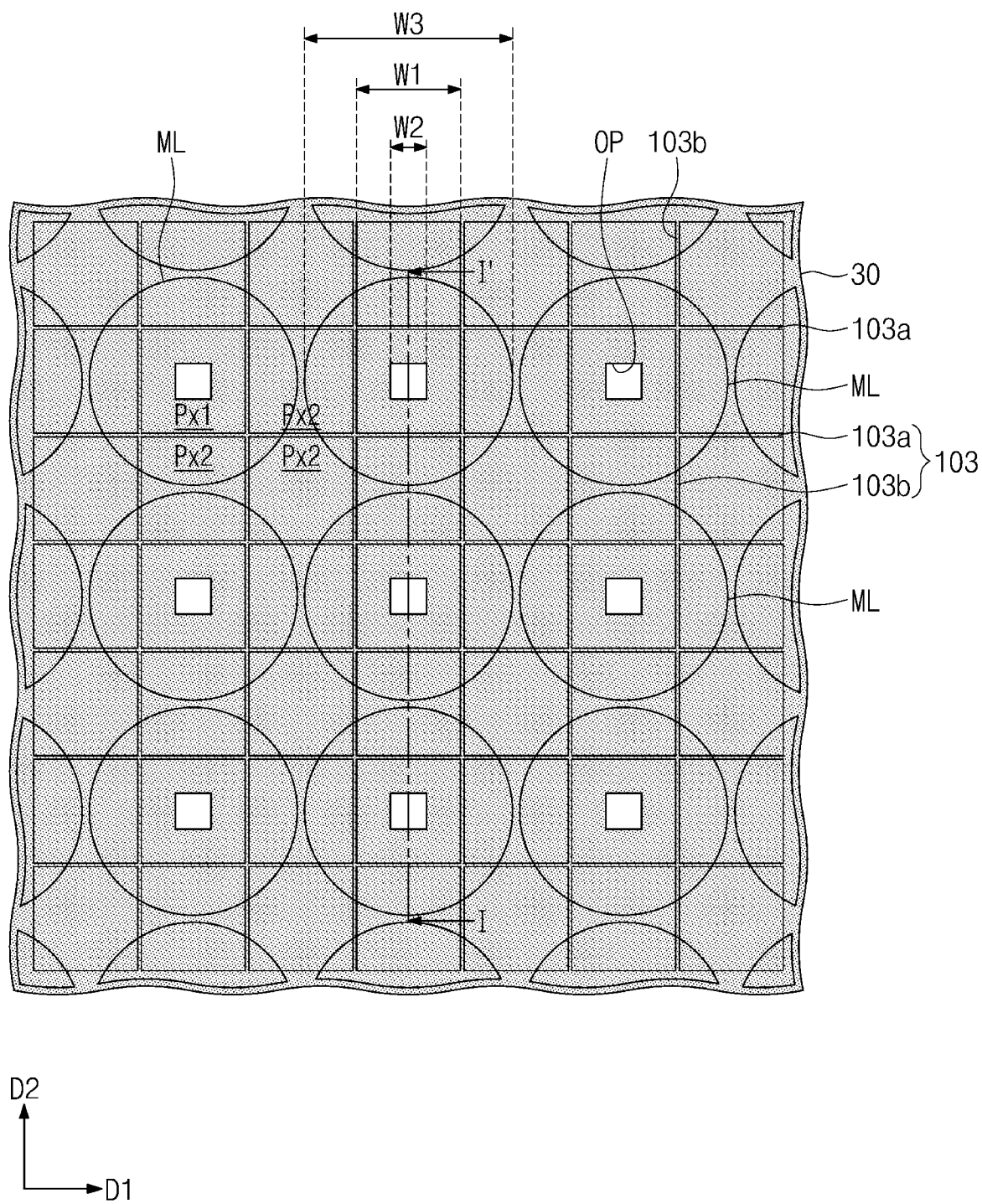
FIG. 4 illustrates a plan view showing an image sensor according to some example embodiments of the present inventive concepts.
Figure 5A:
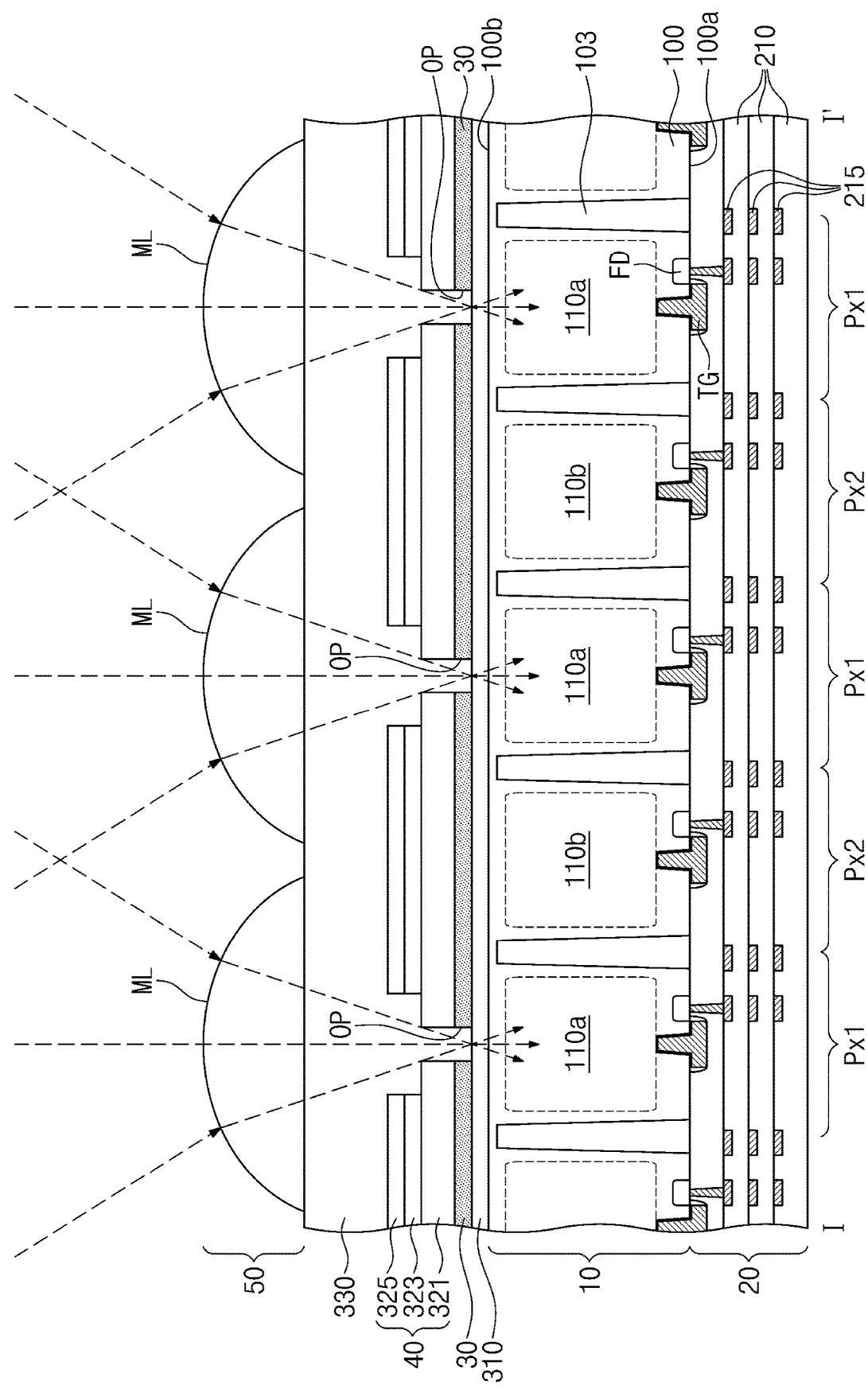
FIGS. 5A and 5B illustrate cross sectional views taken along line I-I' of FIG. 4, showing an image sensor according to some example embodiments of the present inventive concepts.
Figure 5B:
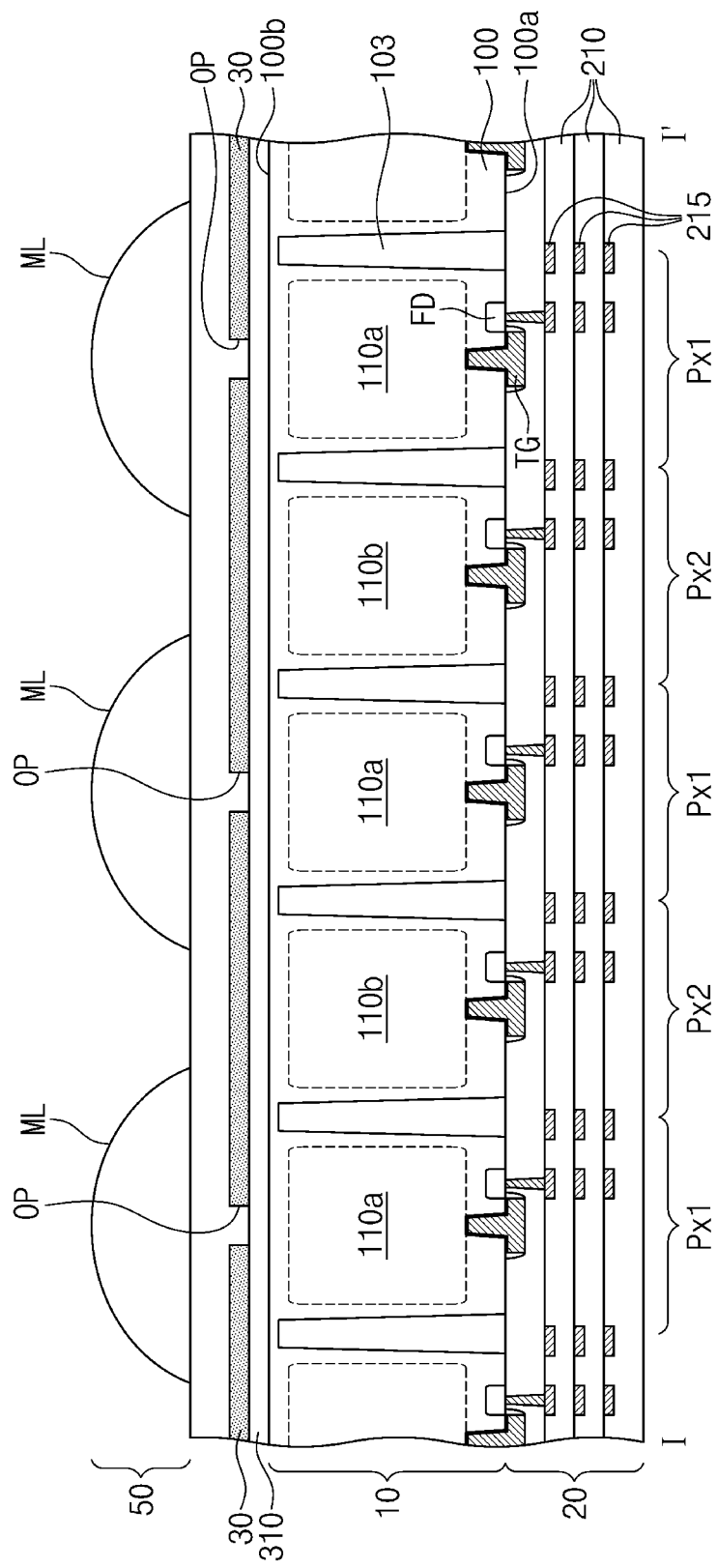

FIG. 4 illustrates a plan view showing an image sensor according to some example embodiments of the present inventive concepts. FIGS. 5A and 5B illustrate cross sectional views taken along line I-I' of FIG. 4, showing an image sensor according to some example embodiments of the present inventive concepts.

Referring to FIGS. 4 and 5A, an image sensor according to some example embodiments of the present inventive concepts may include a photoelectric conversion layer 10, a readout circuit layer 20, a light shield layer 30, a color filter layer 40, and a micro-lens array 50.

When viewed in cross-section, the photoelectric conversion layer 10 may be disposed between the readout circuit layer 20 and the light shield layer 30. When viewed in cross-section, the light shield layer 30 may be disposed between the photoelectric conversion layer 10 and the micro-lens array 50. When viewed in cross-section, the color filter layer 40 may be disposed between the light shield layer 30 and the micro-lens array 50.

The photoelectric conversion layer 10 may include a semiconductor substrate 100 and photoelectric conversion regions 110a and 110b provided in the semiconductor substrate 100. The semiconductor substrate 100 may have a first surface (or a front surface) 100a and a second surface (or a rear surface) 100b on opposites sides of the substrate 100. The photoelectric conversion regions 110a and 110b may be impurity regions doped with impurities having a second conductivity type (e.g., n-type) opposite to a first conductivity type of the semiconductor substrate 100. The photoelectric conversion regions 110a and 110b may convert externally incident light into electrical signals.

The readout circuit layer 20 may be disposed on the first surface 100a of the semiconductor substrate 100. The readout circuit layer 20 may include readout circuits (e.g., MOS transistors) connected to the photoelectric conversion layer 10. The readout circuit layer 20 may process the electrical signals produced by the photoelectric conversion layer 10. For example, the first surface 100a of the semiconductor substrate 100 may be provided thereon with MOS transistors and connection lines 215 connected to the MOS transistors. The connection lines 215 may be stacked across interlayer dielectric layers 210, and contact plugs may connect the connection lines 215 disposed at different levels.

The light shield layer 30 may be disposed to entirely cover the second surface 100b of the semiconductor substrate 100. For example, the light shield layer 30 may have a plate shape that extends in a first direction D1 and a second direction D2 that intersect each other. The light shield layer 30 may have openings OP that partially expose the photoelectric conversion regions 110a and 110b. The openings OP of the light shield layer 30 may be arranged spaced apart from each other along the first and second directions D1 and D2.

The color filter layer 40 may include a first color filter layer 321, a second color filter layer 323, and a third color filter layer 325 that are sequentially stacked on the light shield layer 30. The first, second, and third color filter layers 321, 323, and 325 may have different colors from each other, and may exhibit a black color achieved by mixture of three colors.

The micro-lens array 50 may include a plurality of micro-lenses ML that concentrate externally incident light. The micro-lenses ML may be two-dimensionally arranged along the first and second directions D1 and D2 intersecting each other.

For example, the semiconductor substrate 100 may be an epitaxial layer formed on a bulk silicon substrate having the same first conductivity type (e.g., p-type) as that of the epitaxial layer, or a p-type epitaxial layer from which a bulk silicon substrate is removed in a fabrication process of the image sensor. For another example, the semiconductor substrate 100 may be a bulk semiconductor substrate having a well of the first conductivity type.

The semiconductor substrate 100 may include a plurality of pixel regions Px1 and Px2 that are defined by a pixel isolation structure 103. The plurality of pixel regions Px1 and Px2 may be arranged in a matrix shape along the first and second directions D1 and D2 intersecting each other.

When viewed in plan, the pixel isolation structure 103 may surround each of the pixel regions Px1 and Px2. For example, the pixel isolation structure 103 may include a plurality of first pixel isolation layers 103a that extend in parallel along the first direction D1, and also include a plurality of second pixel isolation layers 103b that extend in parallel along the second direction D2 and cross the first pixel isolation layers 103a.

The first pixel isolation layers 103a may be spaced apart from each other at a first interval W1 along the second direction D2, and the second pixel isolation layers 103b may be spaced apart from each other at the first interval W1 along the first direction D1. In certain embodiments, each of the pixel regions Px1 and Px2 may have a width W1 corresponding to the first interval W1 between the first pixel isolation layers 103a adjacent to each other or between the second pixel isolation layers 103b adjacent to each other.

The pixel isolation structure 103 may be formed of a dielectric material whose refractive index is less than that of the semiconductor substrate 100 (e.g., silicon), and may include one or a plurality of dielectric layers. The pixel isolation structure 103 may include, for example, a silicon oxide layer, a silicon nitride layer, an undoped polysilicon layer, air, or a combination thereof. The formation of the pixel isolation structure 103 may include forming a deep trench by patterning the first surface 100a and/or the second surface 100b of the semiconductor substrate 100, and then filling the deep trench with a dielectric material.

When viewed in cross-section, the pixel isolation structure 103 may vertically extend from the first surface 100a toward the second surface 100b of the semiconductor substrate 100, and may be spaced apart from the second surface 100b of the semiconductor substrate 100. For example, the pixel isolation structure 103 may have a vertical thickness less than that of the semiconductor substrate 100. For another example, the pixel isolation structure 103 may penetrate the semiconductor substrate 100. In this case, the pixel isolation structure 103 may have a vertical thickness substantially the same as that of the semiconductor substrate 100. For another example, the pixel isolation structure 103 may be an impurity region where the semiconductor substrate 100 is doped with impurities having the same first conductivity type as that of the semiconductor substrate 100.

In certain embodiments, the pixel regions Px1 and Px2 defined by the pixel isolation structure 103 may include a plurality of first pixel regions Px1 and a plurality of second pixel regions Px2.

The first pixel regions Px1 may be sensing pixels that output electrical signals generated in proportion to incident light. The electrical signals output from the first pixel regions Px1 may include not only photoelectric conversion signals but noise signals as well.

The second pixel regions Px2 may be reference pixel regions that output electrical signals (or reference signals) created by electrons caused by heat under conditions in which substantially no light is incident on the reference pixel regions. The reference signals output from the second pixel regions Px2 may be provided as reference values of the electrical signals output from the first pixel regions Px1. The reference signal generated from the second pixel regions Px2 may be an average value of the electrical signals output from unit pixels of the second pixel regions Px2, which may result in accuracy of the reference signal. In certain embodiments, the number of the second pixel regions Px2 may be changed to increase the accuracy of the reference signal generated from the second pixel regions Px2. For example, the number of the second pixel regions Px2 may be greater than the number of the first pixel regions Px1. One first pixel region Px1 and three second pixel regions Px2 may constitute a single pixel group, and a plurality of the pixel groups may be arranged along the first and second directions D1 and D2.

The photoelectric conversion regions 110a and 110b may be provided in corresponding pixel regions Px1 and Px2 of the semiconductor substrate 100. When viewed in plan, each of the photoelectric conversion regions 110a and 110b may be surrounded by the pixel isolation structure 103. In certain embodiments, the photoelectric conversion regions 110a and 110b may include first photoelectric conversion regions 110a provided on the first pixel regions Px1 and second photoelectric conversion regions 110b provided on the second pixel regions Px2. The first and second photoelectric conversion regions 110a and 110b may have substantially the same structure and material.

For example, the first and second photoelectric conversion regions 110a and 110b may be formed by implanting the semiconductor substrate 100 with impurities having a second conductivity type opposite to the first conductivity type of the semiconductor substrate 100. Photodiodes may be formed by junctions between the semiconductor substrate 100 having the first conductivity type and the first and second photoelectric conversion regions 110a and 110b having the second conductivity type.

On the pixel regions Px1 and Px2, transfer gate electrodes TG may be disposed on the first surface 100a of the semiconductor substrate 100, and the readout circuits discussed with reference to FIG. 2 may also be provided.

When viewed in plan, the transfer gate electrode TG may be positioned on a central portion of each of the pixel regions Px1 and Px2. A portion of the transfer gate electrode TG may be disposed in the semiconductor substrate 100, and a gate dielectric layer may be interposed between the transfer gate electrode TG and the semiconductor substrate 100.

A floating diffusion region FD may be provided in the semiconductor substrate 100 on one side of the transfer gate electrode TG. The floating diffusion region FD may be formed by implanting the semiconductor substrate 100 with impurities whose conductivity type is opposite to that of semiconductor substrate 100. The floating diffusion region FD may be, for example, an n-type impurity region.

Interlayer dielectric layers 210 may be stacked on the first surface 100a of the semiconductor substrate 100, and may cover the transfer gate electrodes TG and MOS transistors constituting the readout circuits. The interlayer dielectric layers 210 may include, for example, silicon oxide, silicon nitride, or silicon oxynitride.

Connection lines 215 may be disposed on each of the interlayer dielectric layers 210, and may be electrically connected through contact plugs to the readout circuits.

A buffer dielectric layer 310 may be disposed on the second surface 100b of the semiconductor substrate 100. The buffer dielectric layer 310 may prevent the photoelectric conversion regions 110a and 110b from receiving charges (e.g., electrons or holes) resulting from defects present on the second surface 100b of the semiconductor substrate 100. The buffer dielectric layer 310 may include a single layer or a multiple layer. The buffer dielectric layer 310 may include metal oxide, such as aluminum oxide or hafnium oxide.

The light shield layer 30 may be provided on the buffer dielectric layer 310. The light shield layer 30 may have a plate shape that extends along the first and second directions D1 and D2, and the openings OP of the light shield layer 30 may correspond to the first pixel regions Px1 or the first photoelectric conversion regions 110a. When viewed in plan, the openings OP of the light shield layer 30 may overlap corresponding portions of the first photoelectric conversion regions 110a. In this case, each of the first photoelectric conversion regions 110a may receive incident light that passes through the opening OP of the light shield layer 30.

The light shield layer 30 may continuously extend along the first and second directions D1 and D2 from on the first photoelectric conversion regions 110a onto the second photoelectric conversion regions 110b. When viewed in plan, the light shield layer 30 may completely overlap the second photoelectric conversion regions 110b. The light shield layer 30 except for the openings OP thereof may reflect or block incident light that travels toward the second surface 100b of the semiconductor substrate 100. Thus, the second photoelectric conversion regions 110b may receive no incident light. The light shield layer 30 may include metal, such as tungsten or aluminum. In certain embodiments, the openings OP of the light shield layer 30 may have rectangular shapes or circular shapes.

The openings OP of the light shield layer 30 may be disposed spaced apart from each other along the first and second directions D1 and D2. Each of the openings OP may have a center aligned with that of the first pixel region Px1 or the first photoelectric conversion region 110a.

in certain embodiments, widths of the openings OP may be adjusted to cause the first photoelectric conversion regions 110a to receive light whose incident angle is not greater than a certain value, and thus it may be possible to obtain images of approaching or nearby substances. For example, each of the openings OP may have a width W2 less than the width W1 of each of the pixel regions Px1 and Px2, and also less than an interval between the openings OP adjacent to each other. The width W2 of each of the openings OP may be optimized based on vertical distances between the light shield layer 30 and the photoelectric conversion regions 110a and 110b, vertical distances between the light shield layer 30 and the micro-lenses ML, and curvatures of the micro-lenses ML.

When viewed in plan, the openings OP of the light shield layer 30 may be arranged along the first and second directions D1 and D2 to lie disposed between the second pixel regions Px2. The openings OP of the light shield layer 30 may be spaced apart from each other at a regular interval along the first and second directions D1 and D2. When viewed in plan, the second pixel regions Px2 may be disposed around each of the first pixel regions Px1.

The color filter layer 40 may be disposed on the light shield layer 30. Likewise the light shield layer 30, the color filter layer 40 may almost completely cover the second surface 100b of the semiconductor substrate 100, while exposing the openings OP of the light shield layer 30. As discussed above, the color filter layer 40 may include the first color filter layer 321, the second color filter layer 323, and the third color filter layer 325 that are sequentially stacked. The first color filter layer 321 may have first apertures corresponding to the openings OP of the light shield layer 30. The first apertures of the first color filter layer 321 may have inner walls vertically aligned with those of the openings OP of the light shield layer 30. Each of the second and third color filter layers 323 and 325 may have second apertures corresponding to the openings OP of the light shield layer 30, and each of the second apertures may have a width greater than the width W2 of each of the openings OP.

For example, the first color filter layer 321 may be a green color filter layer, the second color filter layer 323 may be a red color filter layer, and the third color filter layer 325 may be a blue color filter layer. For another example, the first color filter layer 321 may be a cyan color filter layer, the second color filter layer 323 may be a magenta color filter layer, and the third color filter layer 325 may be a yellow color filter layer. For another example, the color filter layer 40 may include the first color filter layer 321, but include neither the second color filter layer 323 nor the third color filter layer 325.

As shown in FIG. 5B, no color filter layer may be provided on the light shield layer 30, and a planarized dielectric layer 330 may directly cover the light shield layer 30.

Referring back to FIG. 5A, a planarized dielectric layer 330 may be disposed on the color filter layer 40, and may fill the openings OP of the light shield layer 30 and the apertures of the first, second, and third color filter layers 321, 323, and 325. In order to increase photosensitivity, the planarized dielectric layer 330 may be formed of a material whose refractive index is greater than that of silicon oxide. The planarized dielectric layer 330 may be formed of, for example, a material whose refractive index falls within a range from about 1.4 to about 4.0. For example, the planarized dielectric layer 330 may include $Al_2O_3$, $CeF_3$, $HfO_2$, ITO, MgO, $Ta_2O_5$, $TiO_2$, $ZrO_2$, Si, Ge, ZnSe, ZnS, or $PbF_2$. For another example, the planarized dielectric layer 330 may be formed of a high refractive organic material such as siloxane resin, BCB (benzocyclobutene), polyimide, acryl, parylene C, PMMA (poly(methyl methacrylate)), or PET (polyethylene terephthalate). For another example, the planarized dielectric layer 330 may be formed of strontium titanate ($SrTiO_3$), polycarbonate, glass, bromine, sapphire, cubic zirconia, potassium Niobate ($KNbO_3$), moissanite (SiC), gallium(III) phosphide (GaP), or gallium(III) arsenide (GaAs).

The micro-lenses ML may be two-dimensionally arranged along the first and second directions D1 and D2 on the planarized dielectric layer 330. The micro-lenses ML may be disposed to correspond to the first photoelectric conversion regions 110a. Each of the micro-lenses ML may have a convex shape with a certain curvature radius. The micro-lenses ML may change pathways of light incident on the image sensor and then concentrate the light into the openings OP of the light shield layer 30. The micro-lenses ML may be formed of a light-transmitting resin.

In certain embodiments, the micro-lenses ML may be disposed to correspond to the openings OP of the light shield layer 30. In order to concentrate incident light into the openings OP of the light shield layer 30, the micro-lenses ML may have their centers aligned with corresponding centers of the openings OP of the light shield layer 30. Each of the micro-lenses ML may have a diameter W3 greater than the width W2 of each of the openings OP of the light shield layer 30. The diameter W3 of each of the micro-lenses ML3 may be greater than the width W1 of each of the pixel regions Px1 and Px2. For example, the diameter W3 of each of the micro-lenses ML3 may be about twice the width W1 of each of the pixel regions Px1 and Px2.

When viewed in plan, each of the micro-lenses ML may completely overlap a corresponding one of the first photoelectric conversion regions 110a, and may partially overlap the second photoelectric conversion regions 110b. In this configuration, boundaries between the micro-lenses ML may be placed on the second photoelectric conversion regions 110b.

In certain embodiments, the curvatures of the micro-lenses ML may be optimized based on the widths W2 of the openings OP of the light shield layer 30, vertical distances between the light shield layer 30 and the photoelectric conversion regions 110a and 110b, and vertical distances between the light shield layer 30 and the micro-lenses ML.

The following will now describe image sensors according to some example embodiments of the present inventive concepts with reference to FIGS. 6 to 17. For brevity of description, components the same as those discussed with reference to FIGS. 4, 5A, and 5B are allocated the same reference numerals thereto, and the same technical features will be omitted and differences will be explained.

Figure 6:
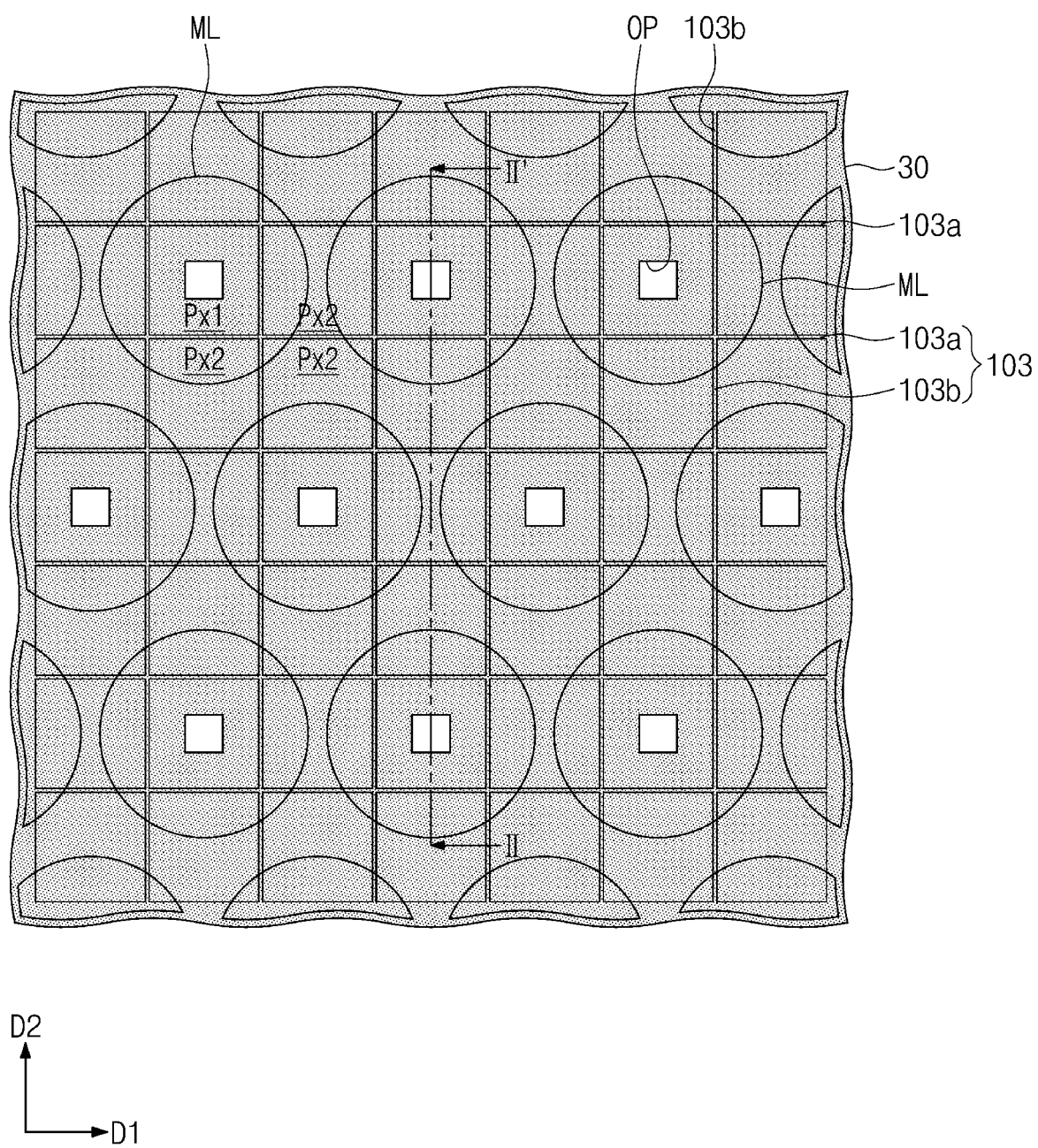
FIG. 6 illustrates a plan view showing an image sensor according to some example embodiments of the present inventive concepts.
Figure 7:
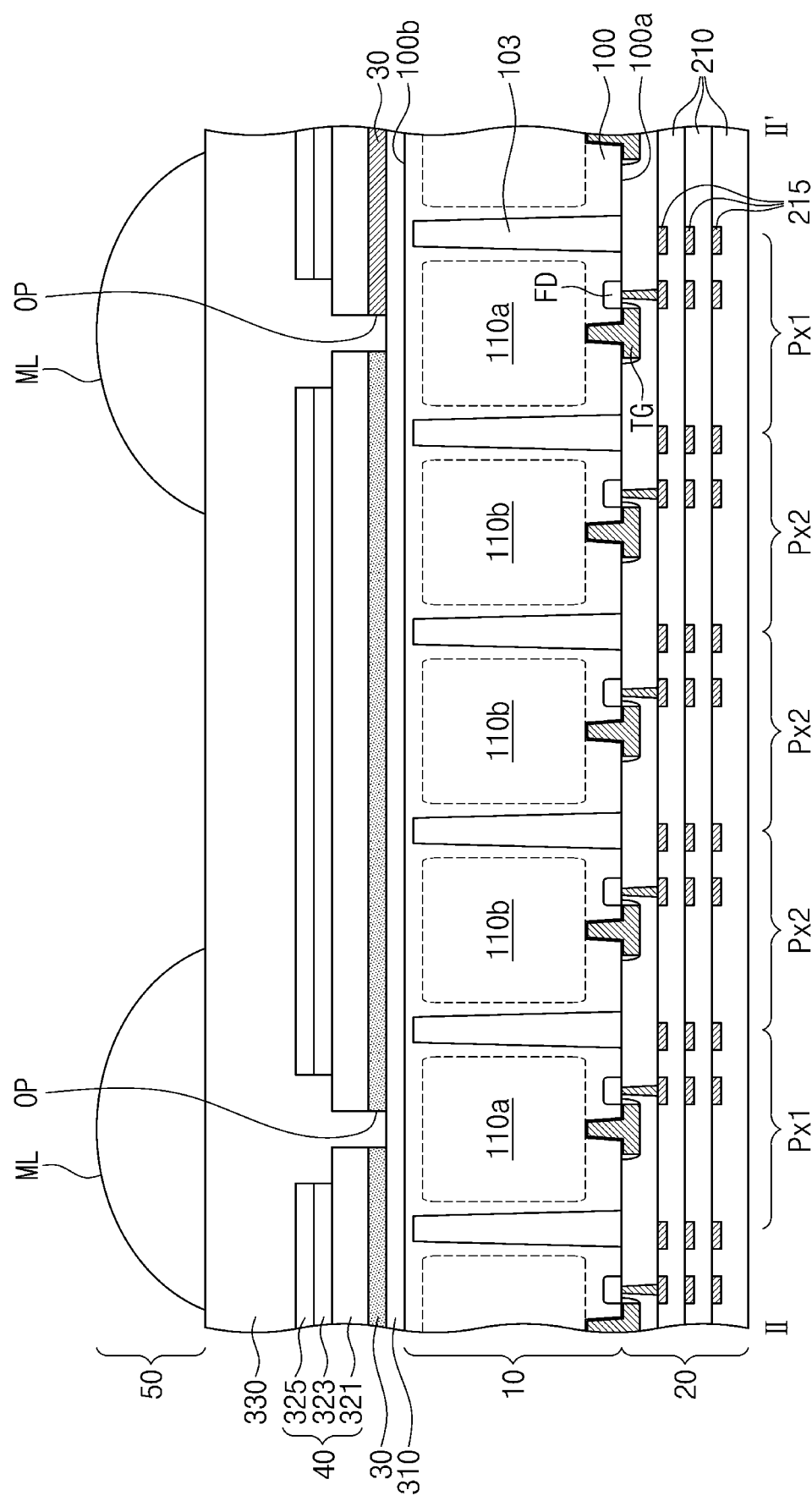
FIG. 7 illustrates a cross-sectional view taken along line II-II' of FIG. 6, showing an image sensor according to some example embodiments of the present inventive concepts.

FIG. 6 illustrates a plan view showing an image sensor according to some example embodiments of the present inventive concepts. FIG. 7 illustrates a cross-sectional view taken along line II-II' of FIG. 6, showing an image sensor according to some example embodiments of the present inventive concepts.

Referring to FIGS. 6 and 7, as discussed above, the second pixel regions Px2 may be disposed around each of the first pixel regions Px1. When viewed in plan, the openings OP of the light shield layer 30 may be arranged in a zigzag fashion. For example, the openings OP on even-numbered columns may be arranged staggered with respect to the openings OP on odd-numbered columns. In this case, an interval between the openings OP adjacent to each other in the first direction D1 may be different from an interval between the openings OP adjacent to each other in the second direction D2. The micro-lenses ML corresponding to the openings OP of the light shield layer 30 may also be arranged in a zigzag fashion. Each of the micro-lenses ML may completely overlap a corresponding one of the first photoelectric conversion regions 110a, and may partially overlap the second photoelectric conversion regions 110b.

FIGS. 8A to 8D illustrate plan views showing an image sensor according to some example embodiments of the present inventive concepts.

Figure 8A:
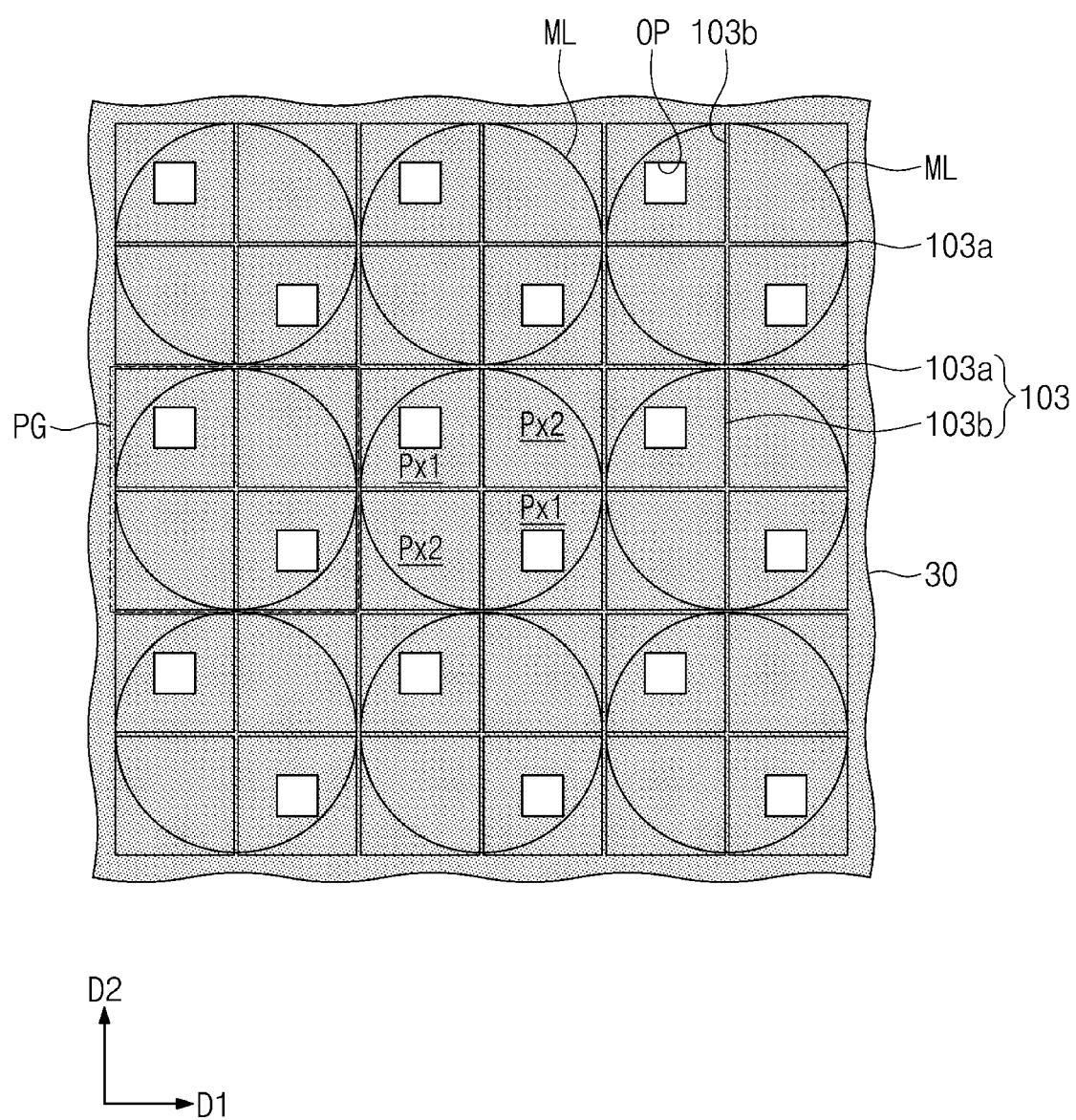
FIGS. 8A to 8D illustrate plan views showing an image sensor according to some example embodiments of the present inventive concepts.
Figure 8B:
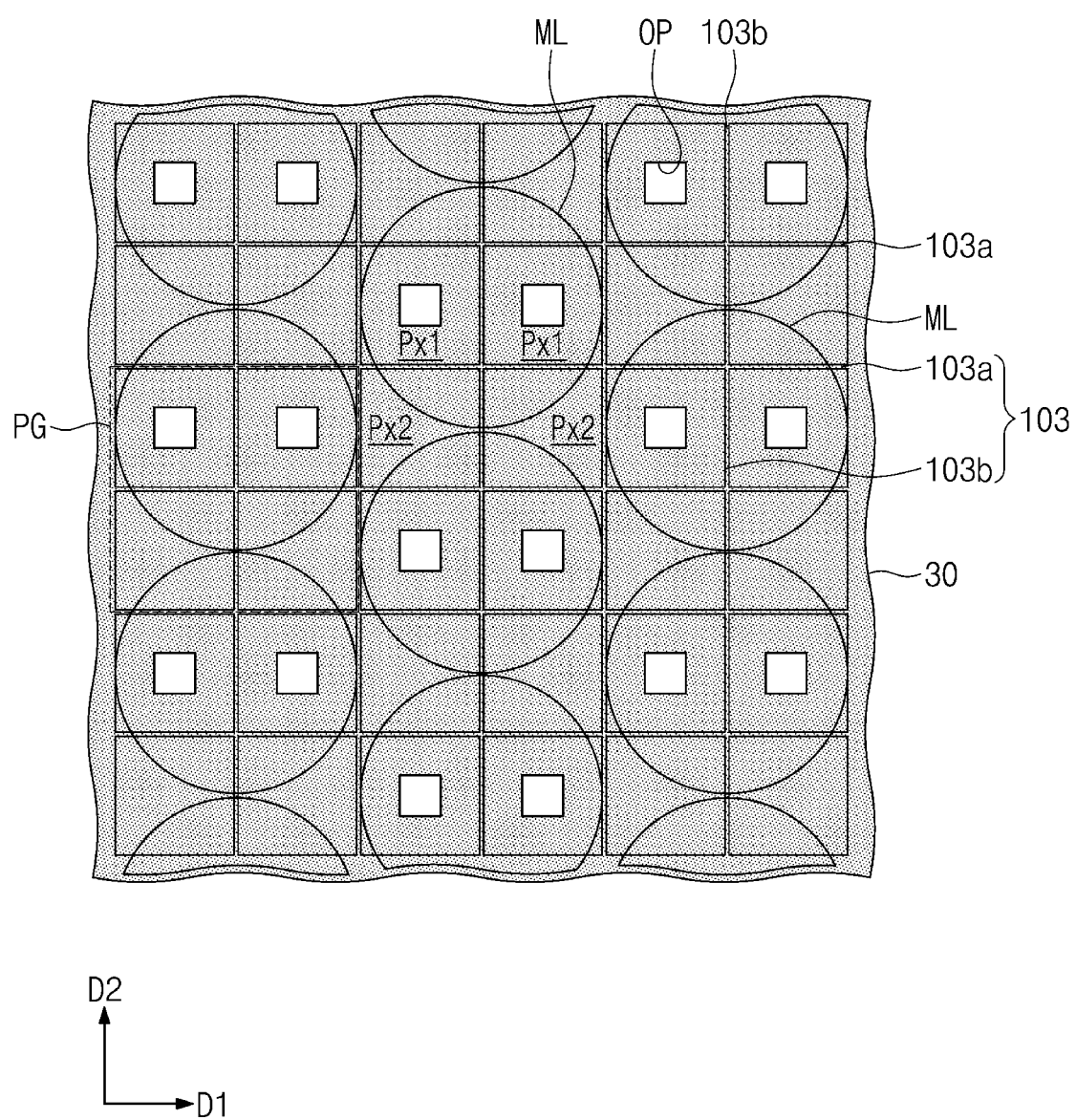

Referring to FIGS. 8A and 8B, an image sensor may include the pixel isolation structure 103 that defines a plurality of the first pixel regions Px1 and a plurality of the second pixel regions Px2. The openings OP of the light shield layer 30 on the semiconductor substrate 100 may correspond to the first pixel regions Px1. The number of the first pixel regions Px1 may be the same as the number of the second pixel regions Px2. As discussed above, the first pixel regions Px1 may be sensing pixels on which light is incident through the opening OP of the light shield layer 30, and the second pixel regions Px2 may be reference pixels on which light is blocked by the light shield layer 30.

Referring to FIG. 8A, two first pixel regions Px1 and two second pixel regions Px2 may constitute a single pixel group PG, the first pixel regions Px1 may be adjacent to each other in a diagonal direction, and the second pixel regions Px2 may be adjacent to each other in the diagonal direction. A plurality of the pixel groups PG may be arranged along the first and second directions D1 and D2. The micro-lenses ML may be aligned with corresponding centers of the pixel groups PG. For example, each of the micro-lenses ML may overlap two openings OP.

Referring to FIG. 8B, two first pixel regions Px1 and two second pixel regions Px2 may constitute a single pixel group PG. Two first pixel regions Px1 may be disposed between the second pixel regions Px2 adjacent to each other in the first direction D1, and one first pixel region Px1 may be disposed between the second pixel regions Px2 adjacent to each other in the second direction D2.

Figure 8C:
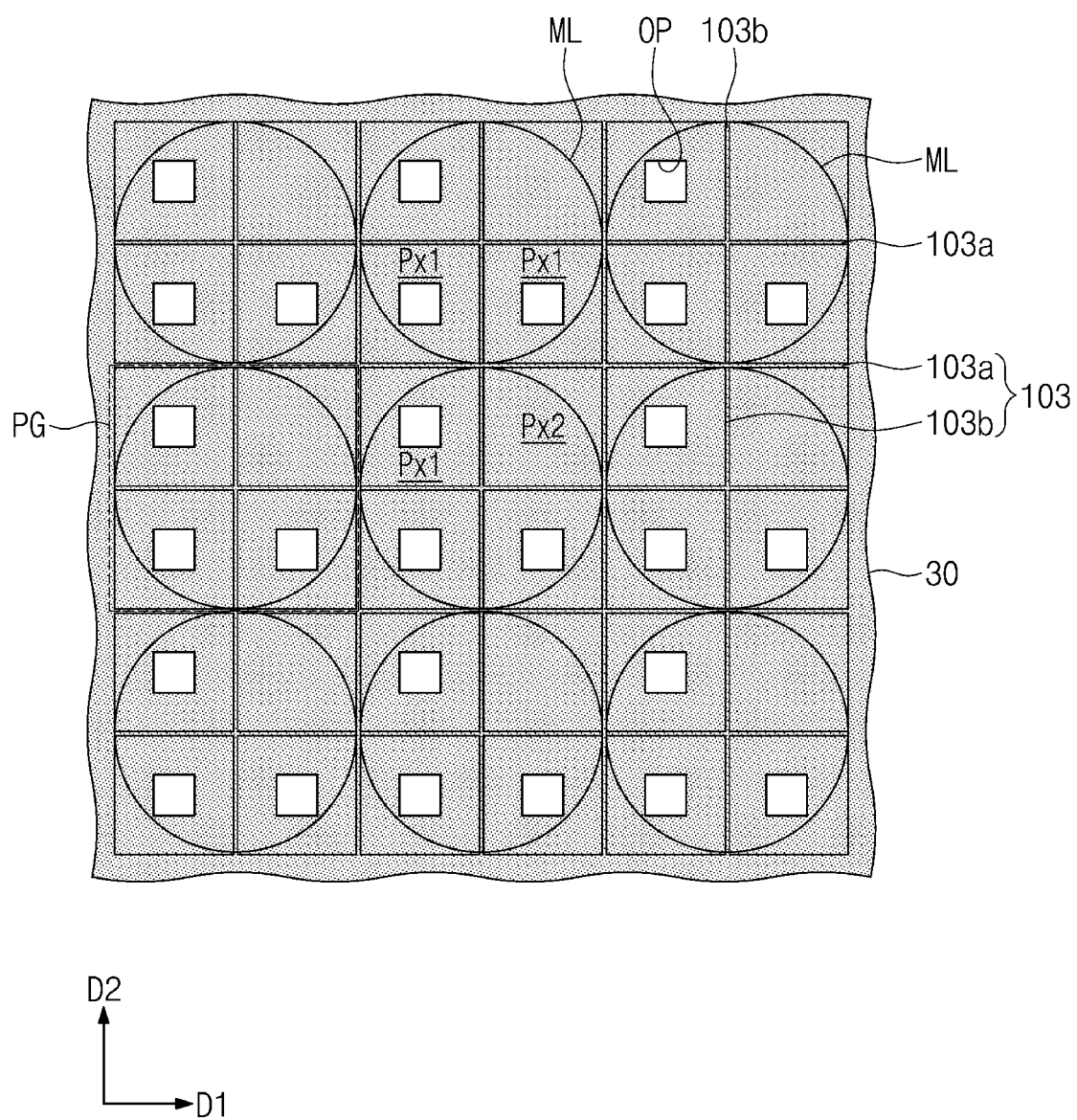
Figure 8D:
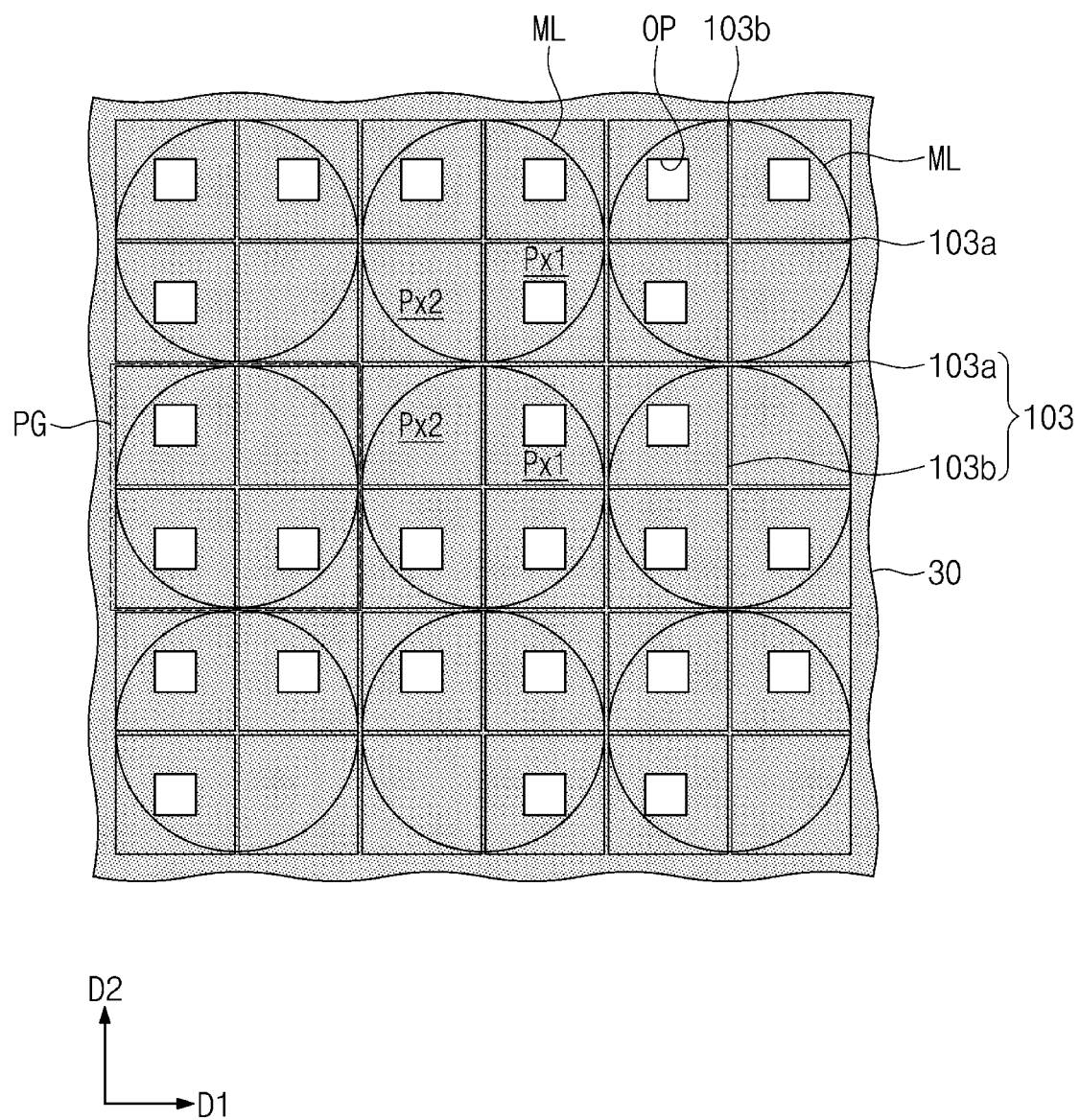

Referring to FIGS. 8C and 8D, three first pixel regions Px1 and one second pixel region Px2 may constitute a single pixel group PG, and a plurality of the pixel groups PG may be arranged along the first and second directions D1 and D2. The number of the first pixel regions Px1 may be greater than the number of the second pixel regions Px2. The micro-lenses ML may be disposed to correspond to the pixel groups PG.

Referring to FIG. 8C, the number of the first pixel regions Px1 on an odd-number column may be different from the number of the second pixel regions Px2 on an even-numbered column. The first pixel regions Px1 may be disposed around each of the second pixel regions Px2. Each of the micro-lenses ML may overlap three openings OP.

Referring to FIG. 8D, two second pixel regions Px2 may be disposed between the first pixel regions Px1 adjacent to each other either in the first direction D1 or in the second direction D2.

Figure 9:
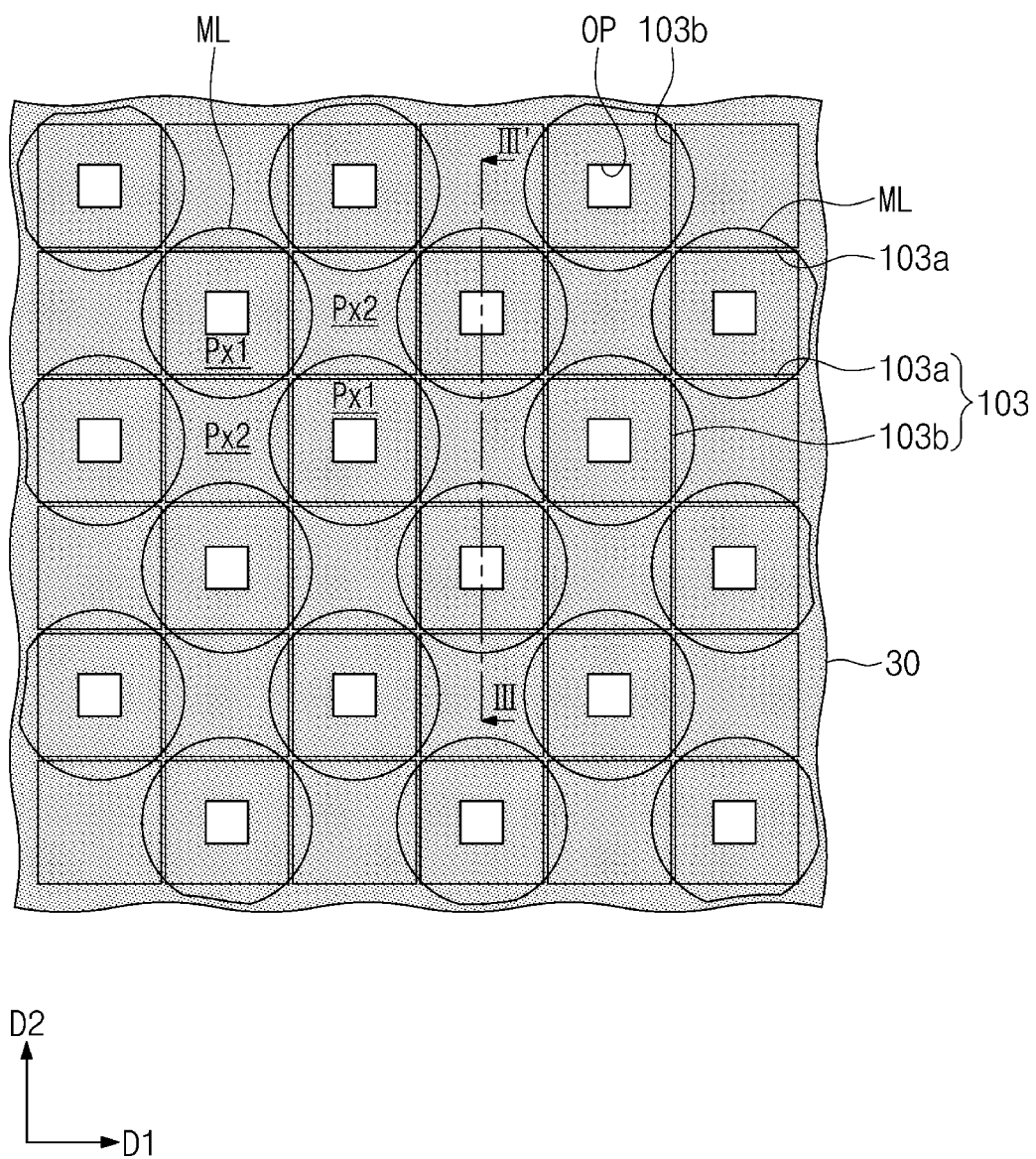
FIG. 9 illustrates a plan view showing an image sensor according to some example embodiments of the present inventive concepts.
Figure 10:
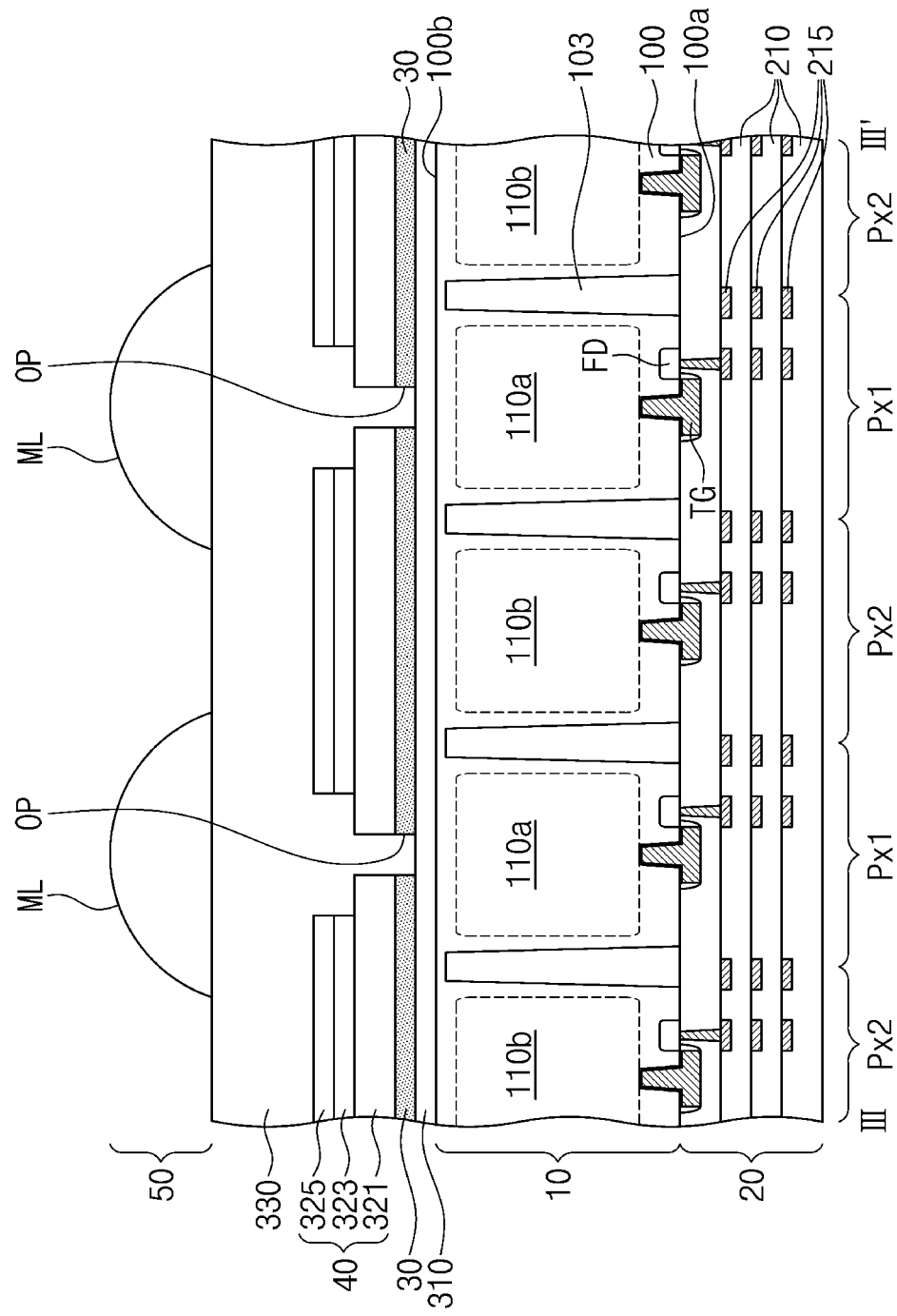
FIG. 10 illustrates a cross-sectional view taken along line III-III' of FIG. 9, showing an image sensor according to some example embodiments of the present inventive concepts.

FIG. 9 illustrates a plan view showing an image sensor according to some example embodiments of the present inventive concepts. FIG. 10 illustrates a cross-sectional view taken along line III-III' of FIG. 9, showing an image sensor according to some example embodiments of the present inventive concepts.

Referring to FIGS. 9 and 10, an image sensor may include the pixel isolation structure 103 that defines a plurality of first pixel regions Px1 and a plurality of second pixel regions Px2, and the first and second pixel regions Px1 and Px2 may be alternately arranged both along the first direction D1 and along the second direction D2.

The openings OP of the light shield layer 30 may be disposed to correspond to the first pixel regions Px1. Each of the second photoelectric conversion regions 110b may be disposed between the openings OP adjacent to each other in the first and second directions D1 and D2.

The micro-lenses ML may have centers aligned with those of the openings OP. When viewed in plan, each of the micro-lenses ML may completely overlap the first photoelectric conversion region 110a on the first pixel region Px1. Each of the micro-lenses ML may have a diameter less than twice the width (see W1 of FIG. 4) of each of the pixel regions Px1 and Px2.

Figure 11A:
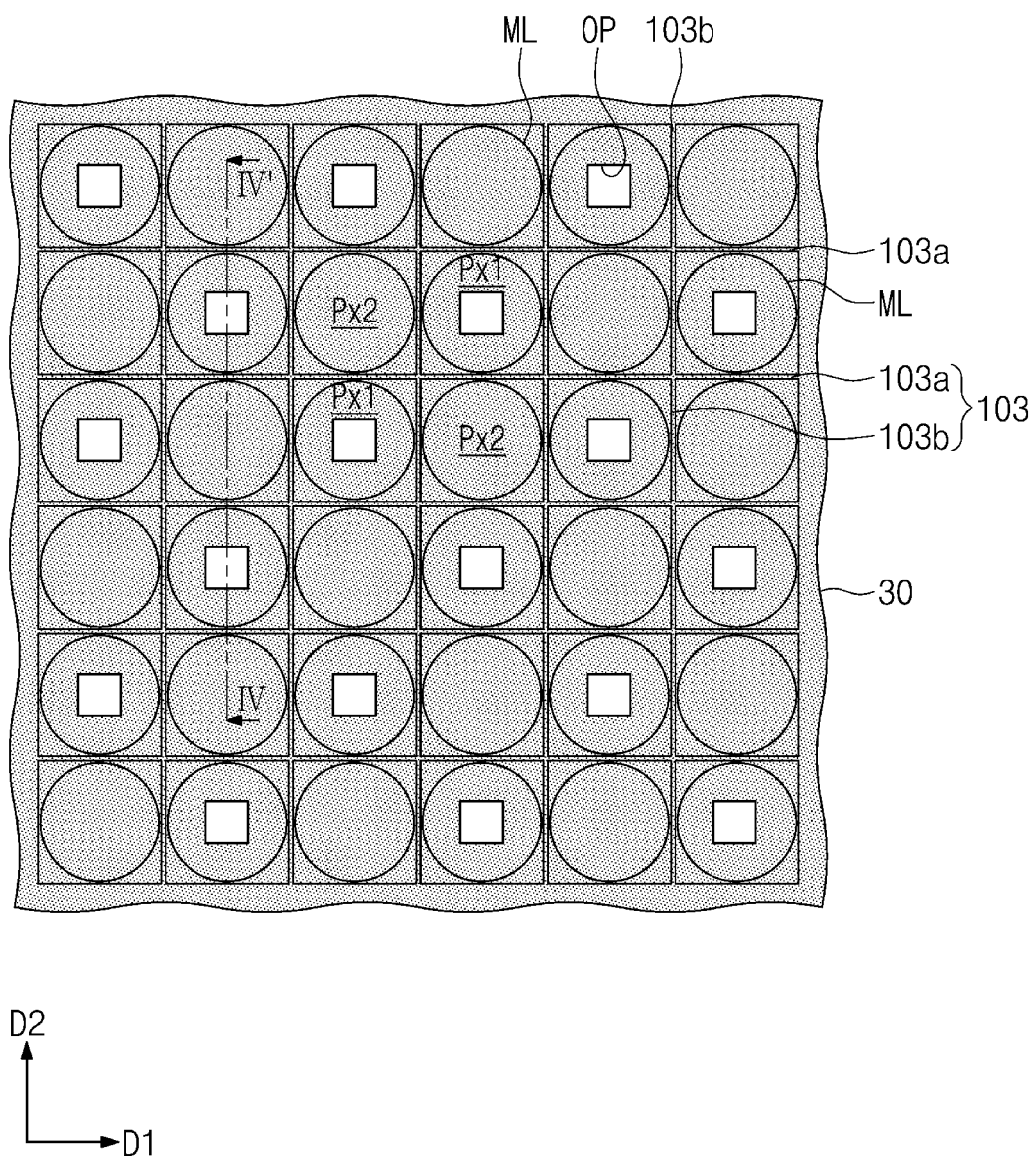
FIGS. 11A and 11B illustrate plan views showing an image sensor according to some example embodiments of the present inventive concepts.
Figure 11B:
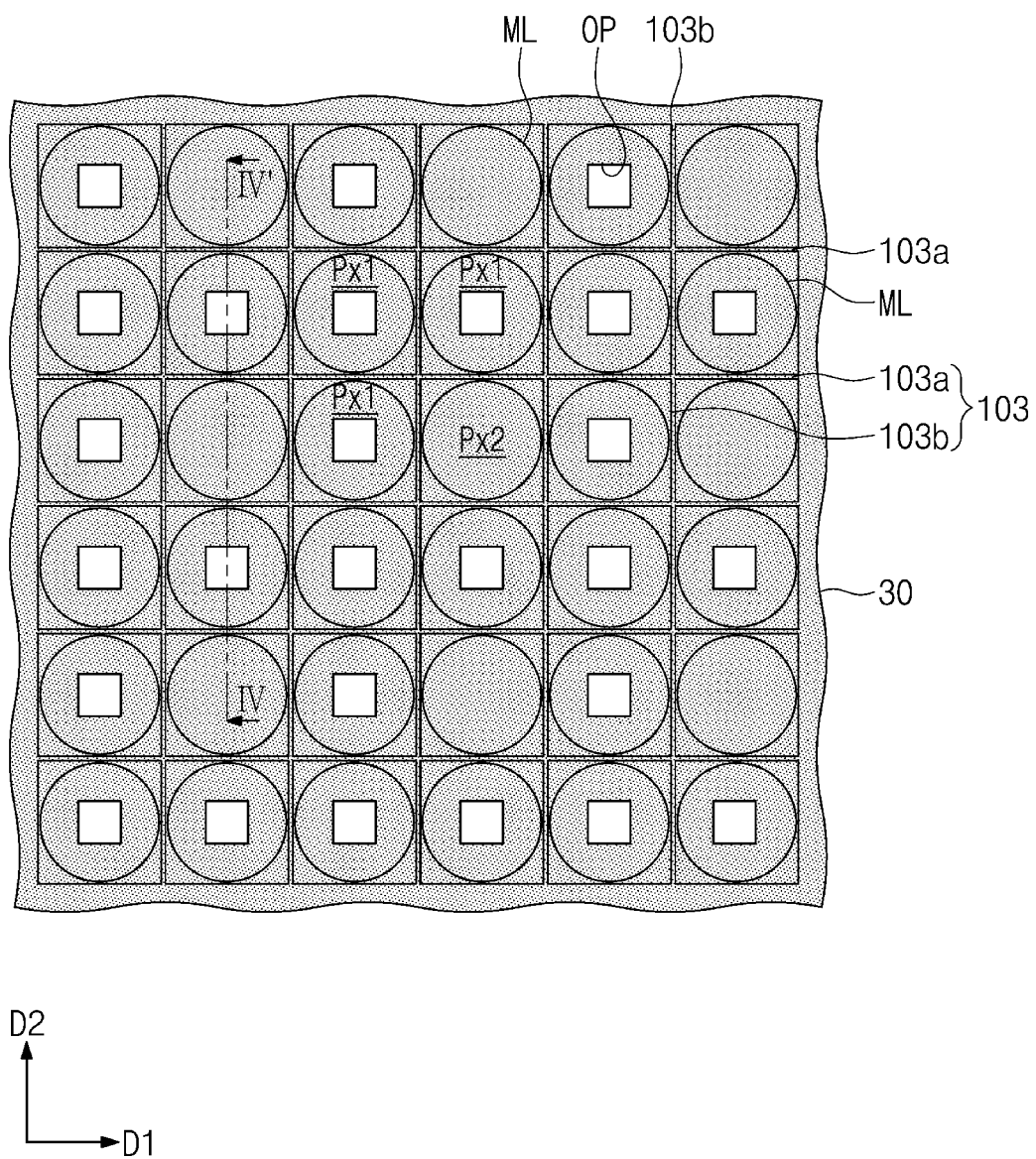
Figure 12:
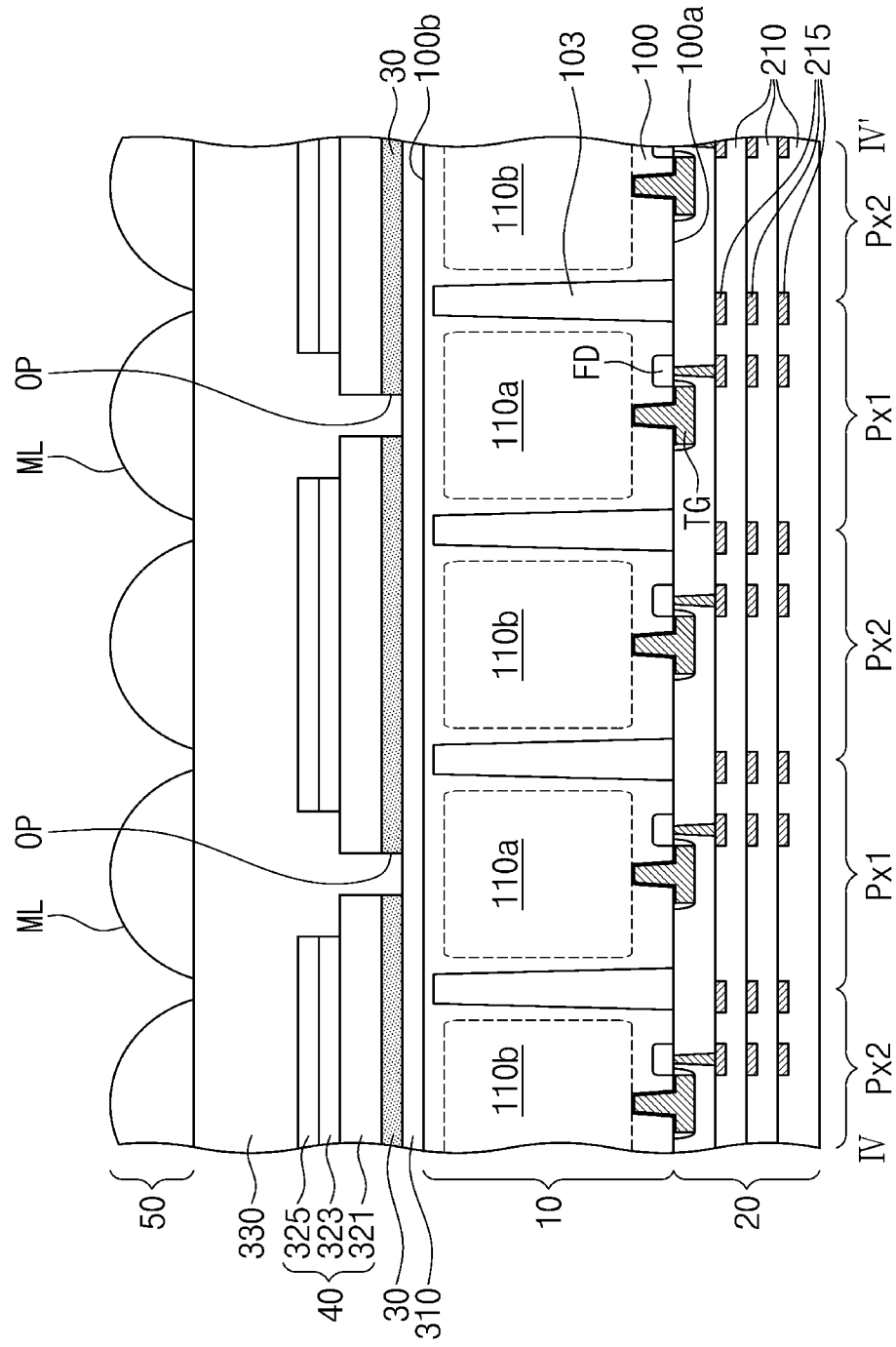
FIG. 12 illustrates a cross sectional view taken along line IV-IV' of FIG. 11A or 11B, showing an image sensor according to some example embodiments of the present inventive concepts.

FIGS. 11A and 11B illustrate plan views showing an image sensor according to some example embodiments of the present inventive concepts. FIG. 12 illustrates a cross sectional view taken along line IV-IV' of FIG. 11A or 11B, showing an image sensor according to some example embodiments of the present inventive concepts.

Referring to FIGS. 11A, 11B, and 12, the micro-lenses ML may be disposed to correspond to the pixel regions Px1 and Px2. For example, each of the micro-lenses ML may have a diameter substantially the same as or less than the width (see W1 of FIG. 4) of each of the pixel regions Px1 and Px2. The micro-lenses ML may have their centers aligned with those of the openings OP. Each of the second photoelectric conversion regions 110b may be disposed between the openings OP adjacent to each other in the first and second directions D1 and D2.

Referring to FIG. 11A, the first and second pixel regions Px1 and Px2 may be alternately arranged both along the first direction D1 and along the second direction D2. Referring to FIG. 11B, the first pixel regions Px1 may be disposed around each of the second pixel regions Px2.

Figure 13A:
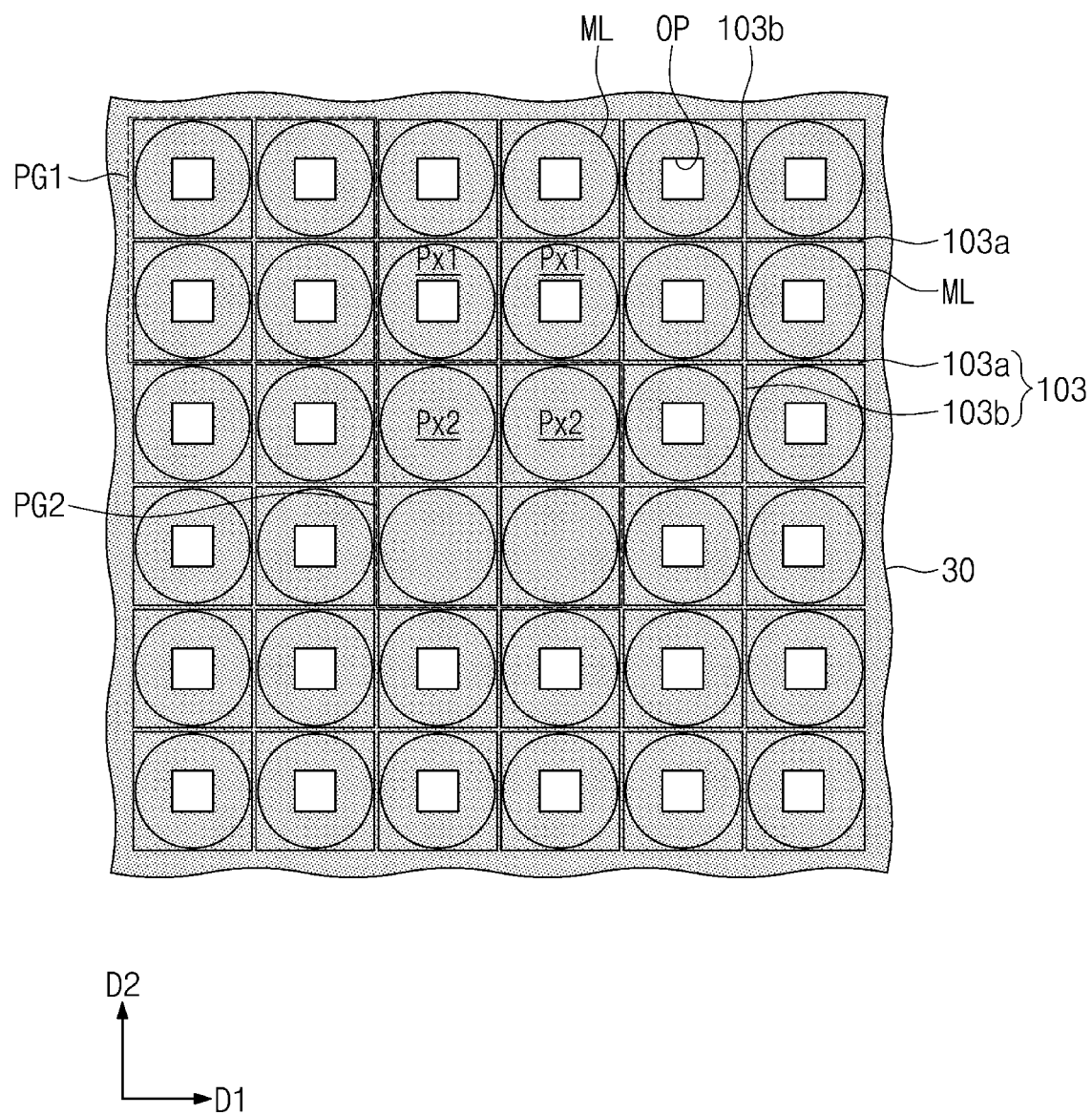
FIGS. 13A and 13B illustrate plan views showing an image sensor according to some example embodiments of the present inventive concepts.
Figure 13B:
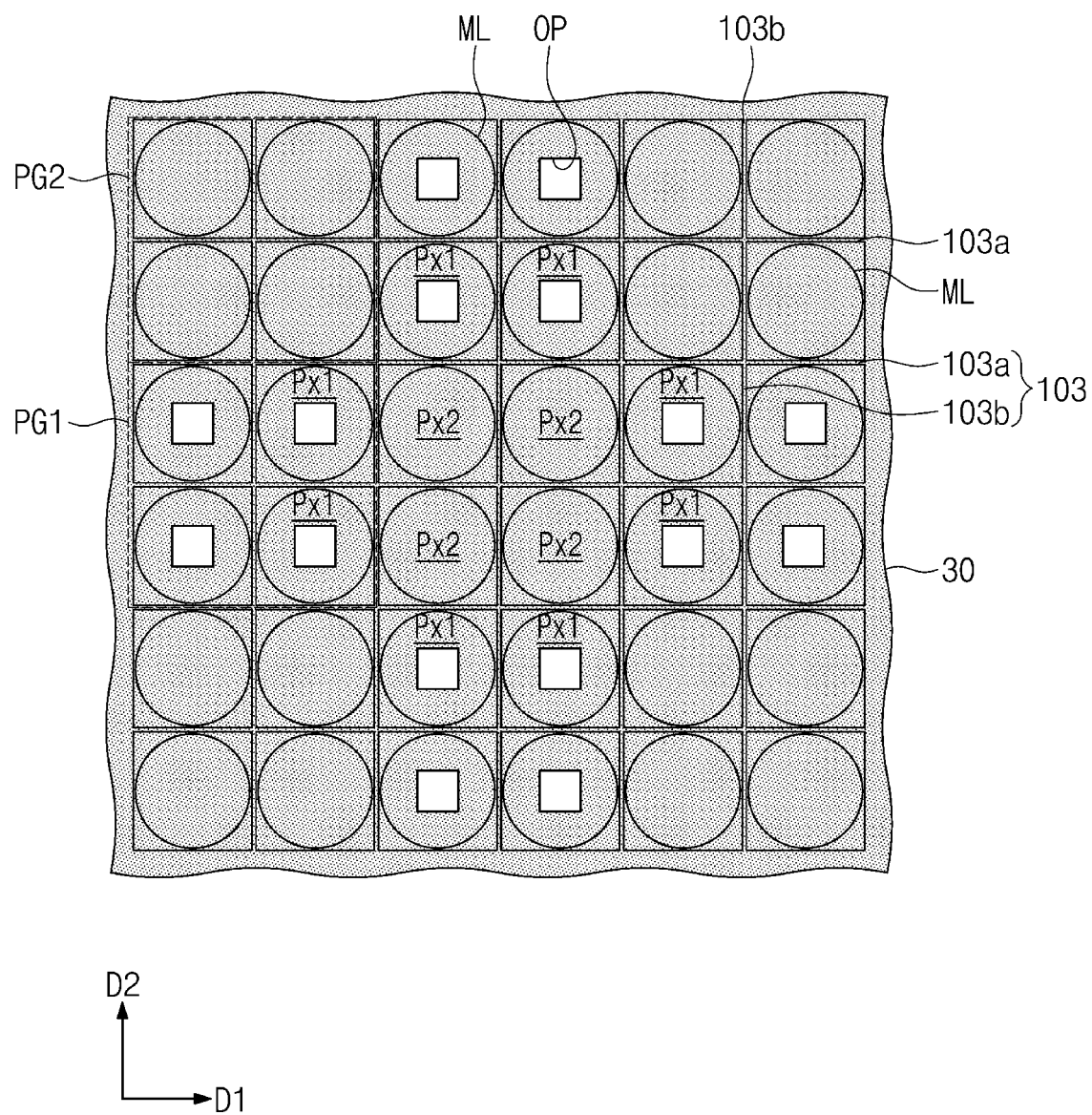

FIGS. 13A and 13B illustrate plan views showing an image sensor according to some example embodiments of the present inventive concepts.

Referring to FIGS. 13A and 13B, four first pixel regions Px1 may constitute a first pixel group PG1, and four second pixel regions Px2 may constitute a second pixel group PG2. The micro-lenses ML may be disposed to correspond to each of the first and second pixel groups PG1 and PG2. For example, each of the micro-lenses ML may have a diameter substantially the same as or less than the width (see W1 of FIG. 4) of each of the pixel regions Px1 and Px2.

Referring to FIG. 13A, a plurality of the first pixel groups PG1 may be provided around one second pixel group PG2. For example, when viewed in plan, a plurality of the first pixel groups PG1 may surround one second pixel group PG2.

Referring to FIG. 13B, the first and second pixel groups PG1 and PG2 may be alternately arranged both along the first direction D1 and along the second direction D2.

Figure 14:
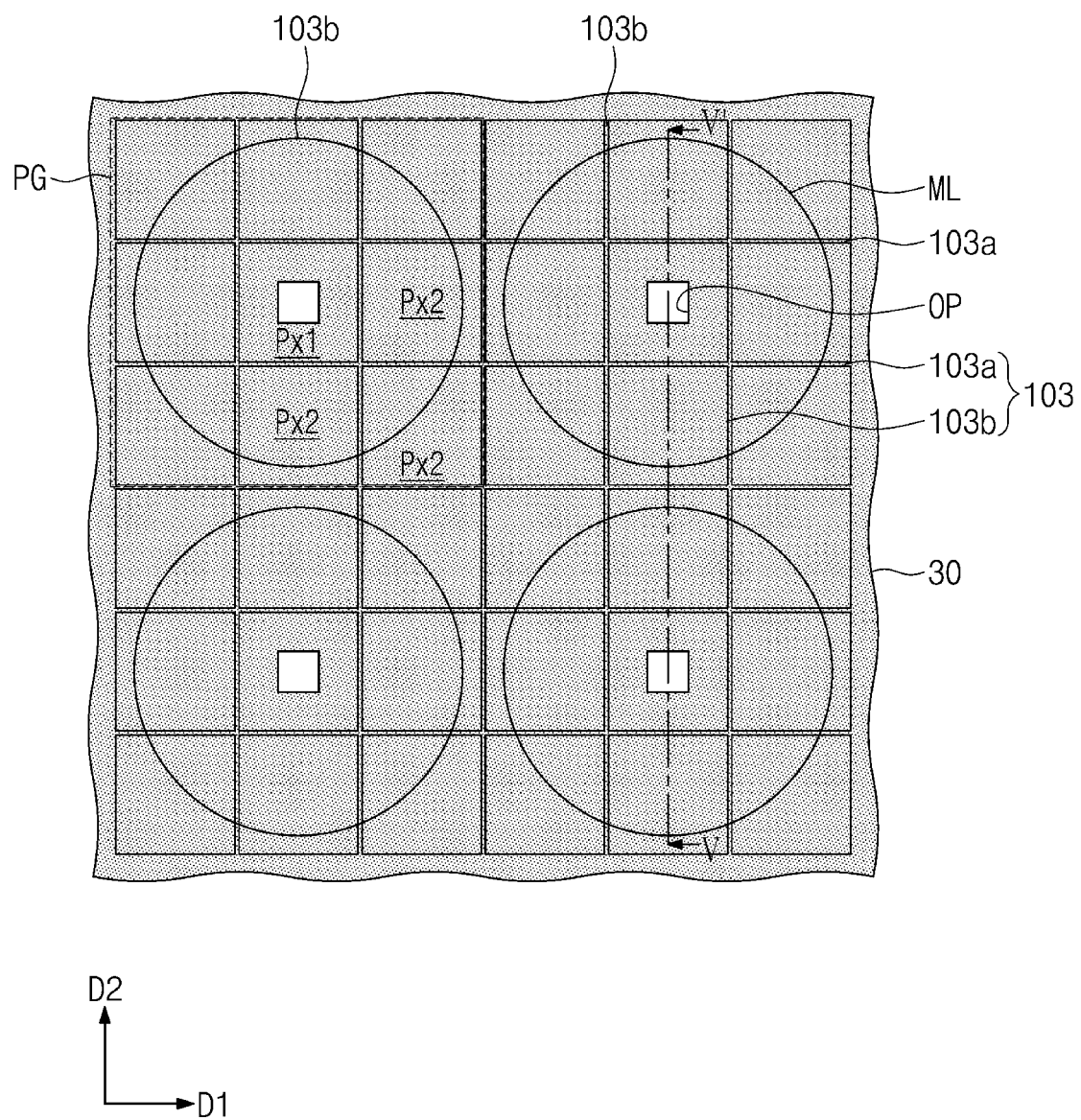
FIG. 14 illustrates a plan view showing an image sensor according to some example embodiments of the present inventive concepts.
Figure 15:
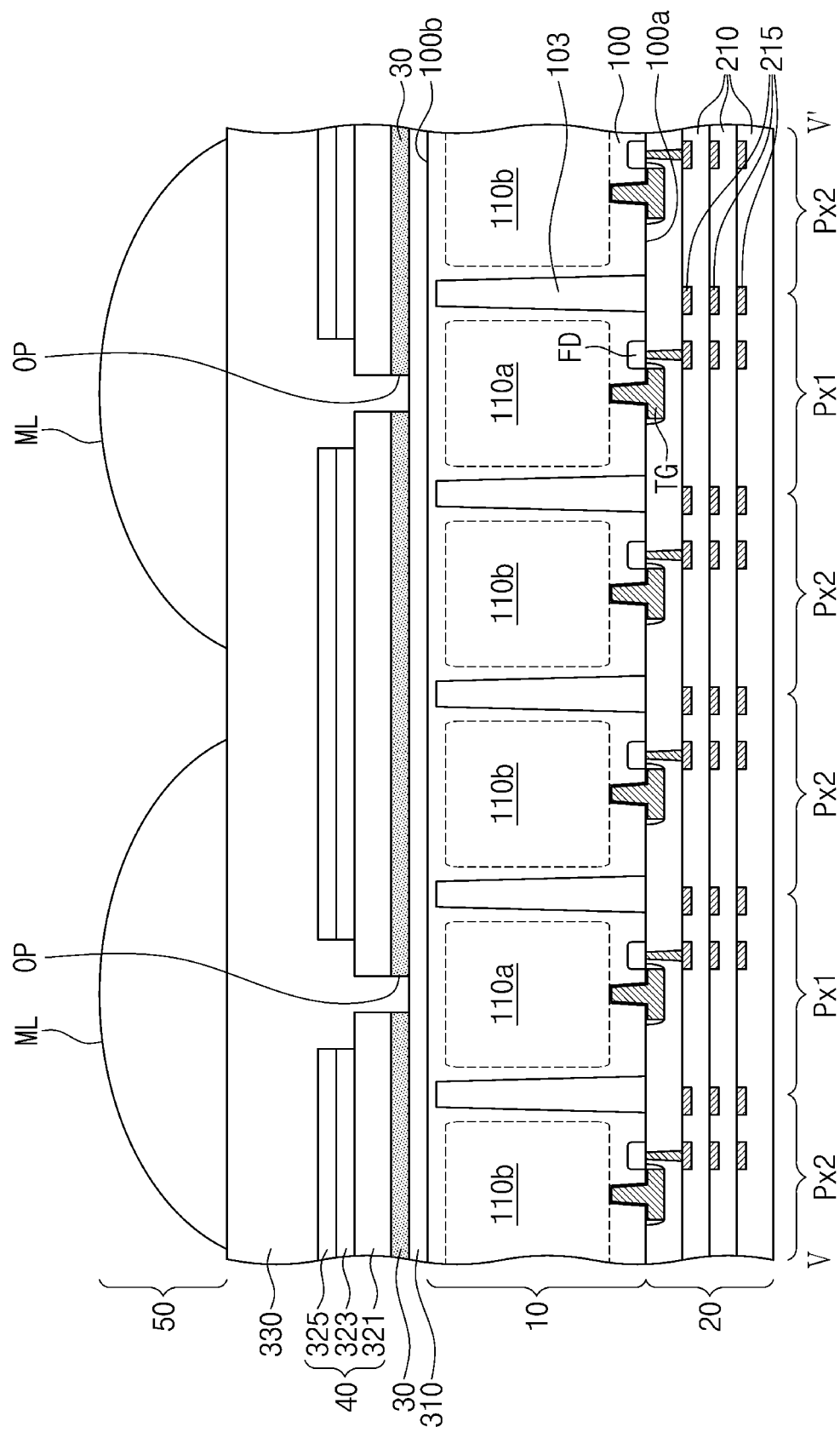
FIG. 15 illustrates a cross-sectional view taken along line V-V' of FIG. 14, showing an image sensor according to some example embodiments of the present inventive concepts.

FIG. 14 illustrates a plan view showing an image sensor according to some example embodiments of the present inventive concepts. FIG. 15 illustrates a cross-sectional view taken along line V-V' of FIG. 14, showing an image sensor according to some example embodiments of the present inventive concepts.

An image sensor according to example embodiments shown in FIGS. 14 and 15 may be configured such that the number of the second pixel regions Px2 is greater than the number of the first pixel regions Px1. For example, referring to FIGS. 14 and 15, the pixel regions Px1 and Px2 arranged in a 3×3 configuration may constitute a single pixel group PG, and a plurality of the pixel groups PG may be arranged along the first and second directions D1 and D2. The single pixel group PG may include one first pixel region Px1, and the openings OP of the light shield layer 30 may correspond to the first pixel regions Px1. For example, two second photoelectric conversion regions 110b may be disposed between the openings OP adjacent to each other either in the first direction D1 or in the second direction D2.

The micro-lenses ML may be disposed to correspond to the pixel groups PG, and may have their centers aligned with those of the openings OP. Each of the micro-lenses ML may have a diameter greater than about twice the width (see W1 of FIG. 4) of each of the pixel regions Px1 and Px2.

Figure 16:
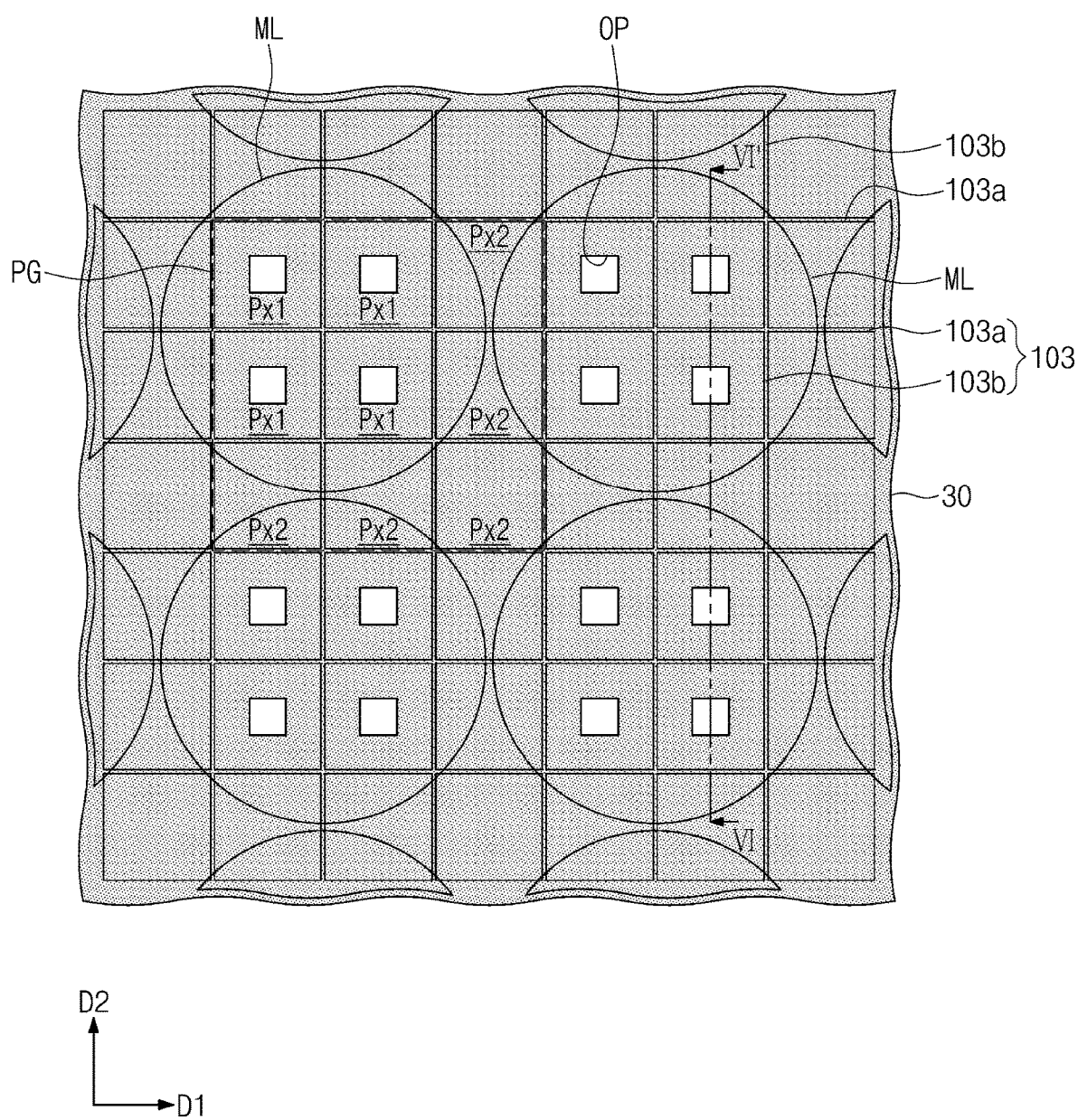
FIG. 16 illustrates a plan view showing an image sensor according to some example embodiments of the present inventive concepts.
Figure 17:
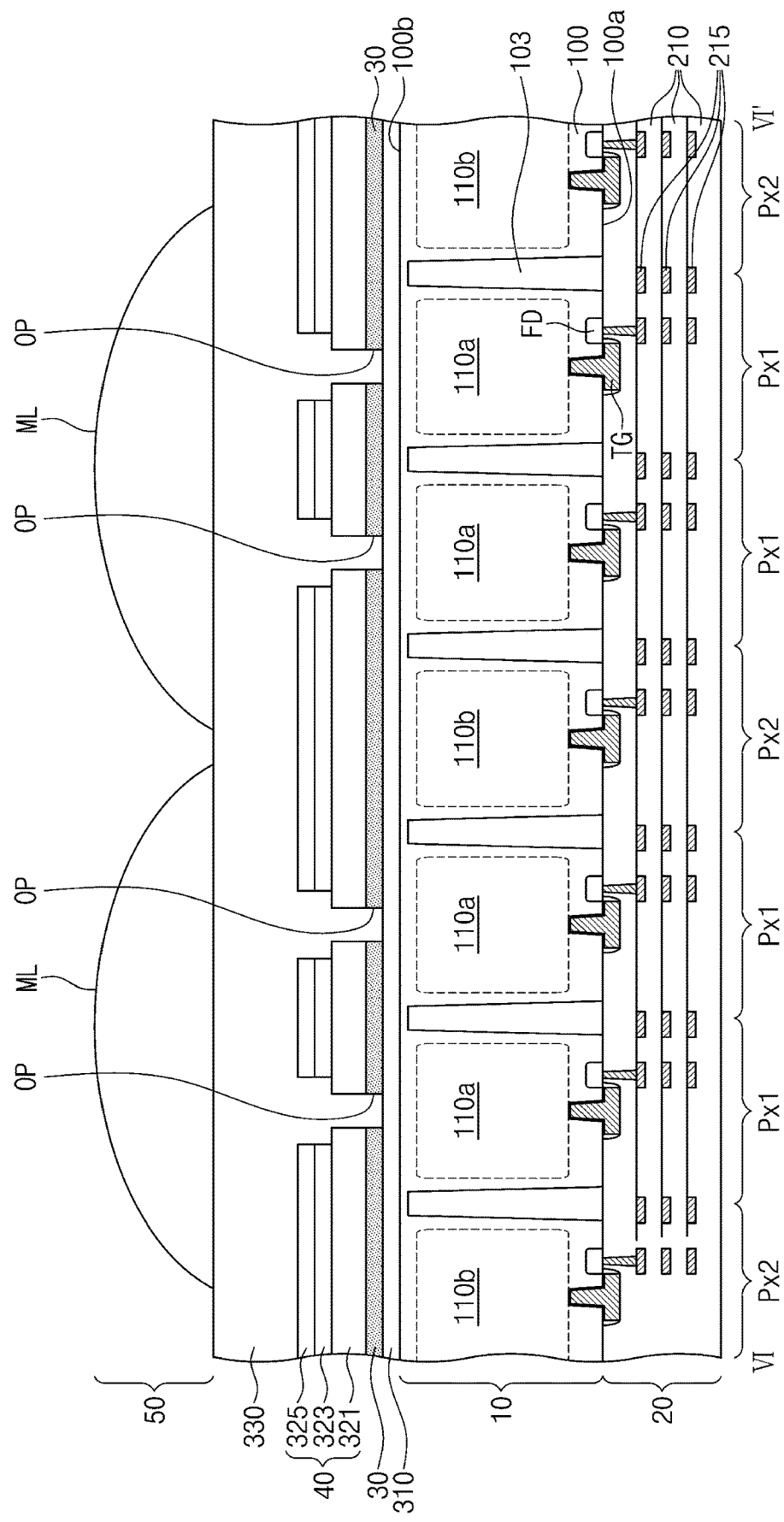
FIG. 17 illustrates a cross-sectional view taken along line VI-VI' of FIG. 16, showing an image sensor according to some example embodiments of the present inventive concepts.

FIG. 16 illustrates a plan view showing an image sensor according to some example embodiments of the present inventive concepts. FIG. 17 illustrates a cross-sectional view taken along line VI-VI' of FIG. 16, showing an image sensor according to some example embodiments of the present inventive concepts.

Referring to FIGS. 16 and 17, the pixel regions Px1 and Px2 arranged in a 3×3 configuration may constitute a single pixel group PG, and a plurality of the pixel groups PG may be arranged along the first and second directions D1 and D2. The single pixel group PG may include four first pixel regions Px1, and each of the micro-lenses ML may be disposed to overlap fourth first pixel regions Px1.

Figure 18:
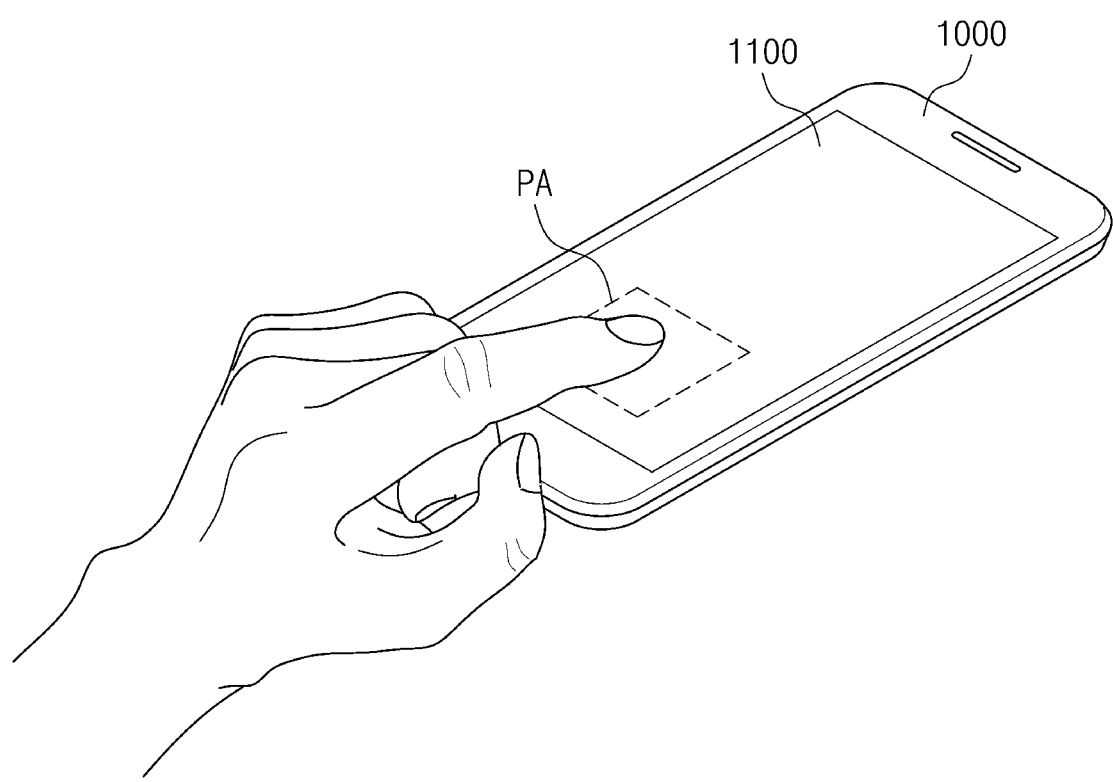
FIG. 18 illustrates a plan view showing an electronic device including an image sensor according to some example embodiments of the present inventive concepts.

FIG. 18 illustrates a plan view showing an electronic device including an image sensor according to some example embodiments of the present inventive concepts.

Referring to FIG. 18, an electronic device 1000 may include a panel 1100 and an image sensor beneath a partial area PA of the panel 1100. The electronic device 1000 may be a portable electronic device or a personal portable terminal, such as a smart phone, a tablet, or a computer. The image sensor may be one of the image sensors discussed above according to some example embodiments of the present inventive concepts, and may sense user's fingerprints and perform a certificate operation based on the sensed fingerprints. The image sensor may be a fingerprint detection sensor or a fingerprint recognition sensor that provides a function of user authentication.

The panel 1100 may interface with a user. For example, the panel 1100 may provide the user with diverse visual information output from the electronic device 1000. For another example, the user may utilize the panel 1100 to input various types of information to the electronic device 1000. To this end, the panel 1100 may include a touch panel for sensing user's touch or a display panel for visually expressing information to the user.

The electronic device 1000 may perform a function of fingerprint detection to provide service for an authenticated user. The electronic device 1000 may collect and store information associated with user's fingerprints. The electronic device 1000 may provide service only for a user who is authenticated based on the stored fingerprint information. The electronic device 1000 may use the image sensor disposed under the panel 1100 in order to detect user's fingerprints.

The user of the electronic device 1000 may employ an object to contact the electronic device 1000. For example, the object may be a user's finger. The electronic device 1000 may recognize the object in response to contact or proximity of the object on or to the panel 1100.

When a user's finger contacts or approaches the partial area PA of the panel 1100, the image sensor may obtain an image associated with fingerprints of the finger that contacts or approaches the partial area PA. Based on the obtained image, the electronic device 1000 may determine whether or not the fingerprints of the finger that contacts or approaches the partial area PA are the authenticated user's fingerprints.

Figure 19:
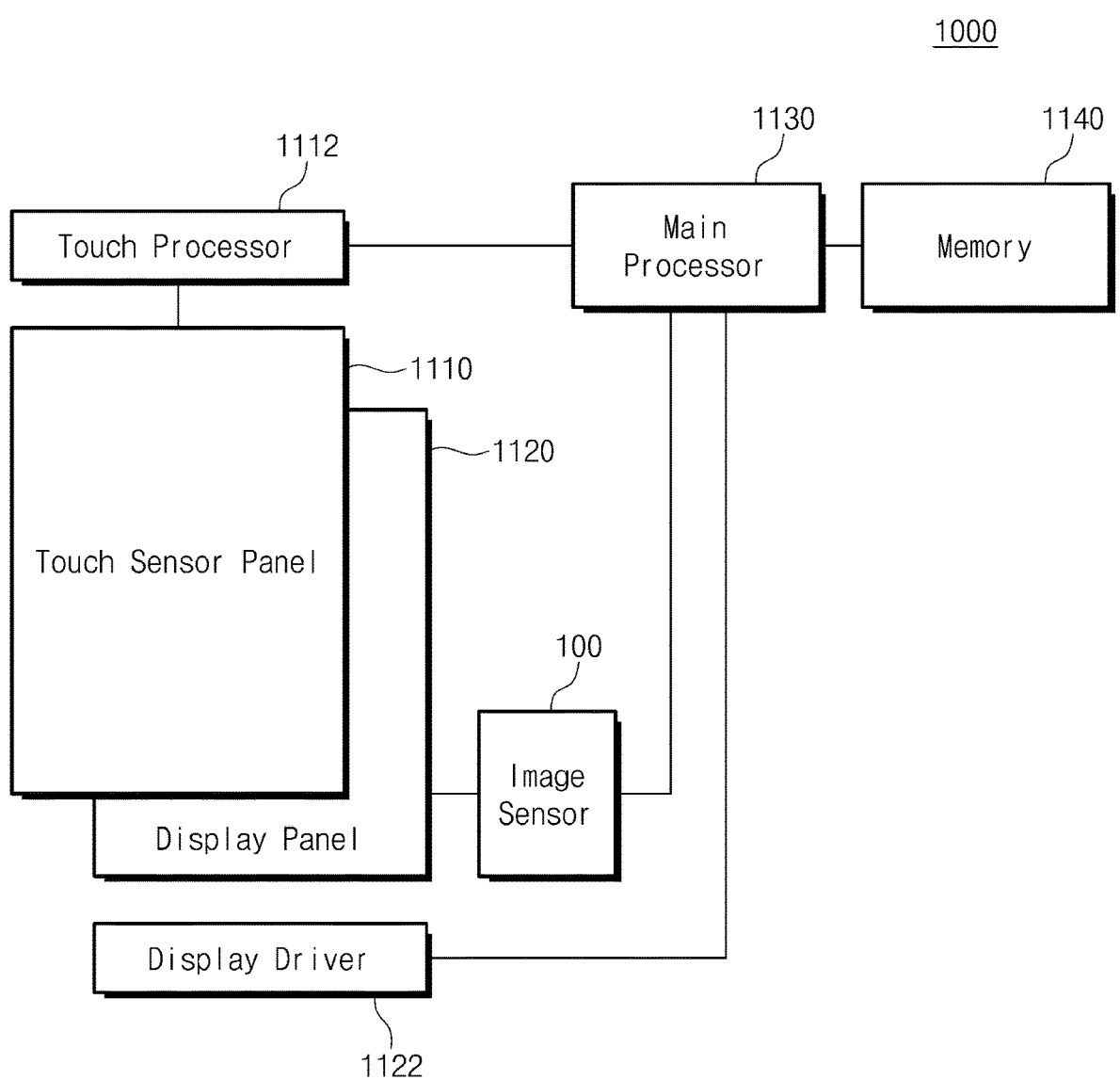
FIG. 19 illustrates a simplified schematic block diagram showing an electronic device including an image sensor according to some example embodiments of the present inventive concepts.

FIG. 19 illustrates a simplified schematic block diagram showing an electronic device including an image sensor according to some example embodiments of the present inventive concepts.

Referring to FIG. 19, an electronic device 1000 may include a touch sensor panel 1110, a touch processor 1112, a display panel 1120, a display driver 1122, a main processor 1130, a memory 1140, and an image sensor 100C.

The touch sensor panel 1110 may sense contact or proximity of an object (e.g., user's finger). For example, the touch sensor panel 1110 may generate a sensing signal in response to the contact or proximity of the object. In certain embodiments, the touch sensor panel 1110 may include a plurality of sensing capacitors that are formed in rows and columns.

The touch processor 1112 may process operations associated with the contact or proximity of the object, based on the sensing signal output from the touch sensor panel 1110. For example, when the sensing signal is associated with execution or operation of a specific application, the touch processor 1112 may provide the main processor 1130 with commands to execute or operate the specific application.

The display panel 1120 may include a plurality of pixels that are arranged along rows and columns, and thus may display images. Each pixel of the display panel 1120 may be configured to emit light having a specific color that forms an image. As light is emitted from the plurality of pixels together, the display panel 1120 may display an intended image. The touch sensor panel 1110 and the display panel 1120 may be implemented separately from each other, or may be configured into a single panel.

The display driver 1122 may drive the display panel 1120. In response to a command of the main processor 1130, the display driver 1122 may drive each pixel of the display panel 1120 to display an intended image.

The main processor 1130 may perform/process various arithmetic/logical operations to provide functions of the electronic device 1000. The main processor 1130 may include a microprocessor or a central processing unit (CPU). The main processor 1130 may communicate with the touch processor 1112, the display driver 1122, the memory 1140, and the image sensor 100C through an address bus, a control bus, and a data bus.

The memory 1140 may store data required for operations of the electronic device 1000. For example, the memory 1140 may include a dynamic random access memory (DRAM), a mobile DRAM, a static random access memory (SRAM), or flash memory.

Based on light emitted from the display panel 1120, the image sensor 100C may generate and output an image signal associated with the object (e.g., a signal for forming an image related to fingerprints) on a portion (e.g., the partial area PA of FIG. 18) of the display panel 1120.

Figure 20:
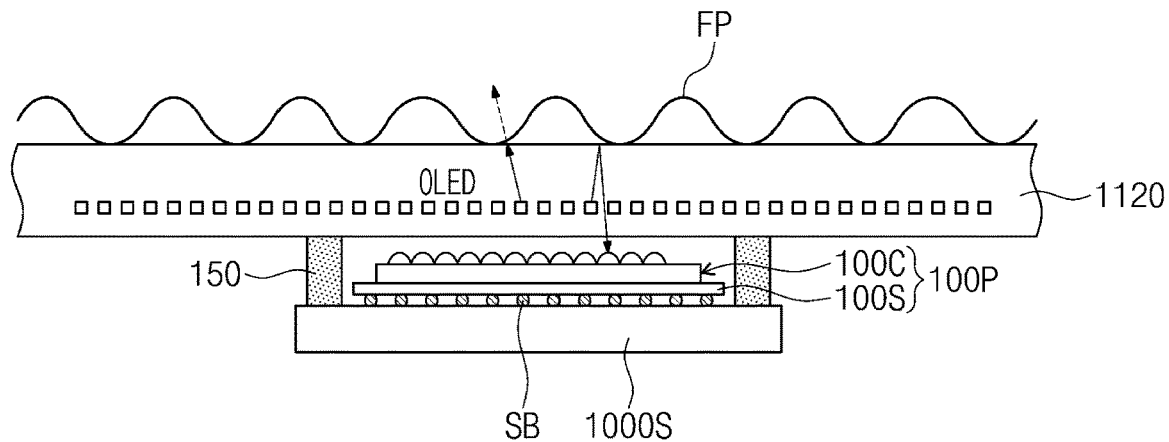
FIG. 20 illustrates a cross-sectional view showing an electronic device including an image sensor according to some example embodiments of the present inventive concepts.
Figure 21:
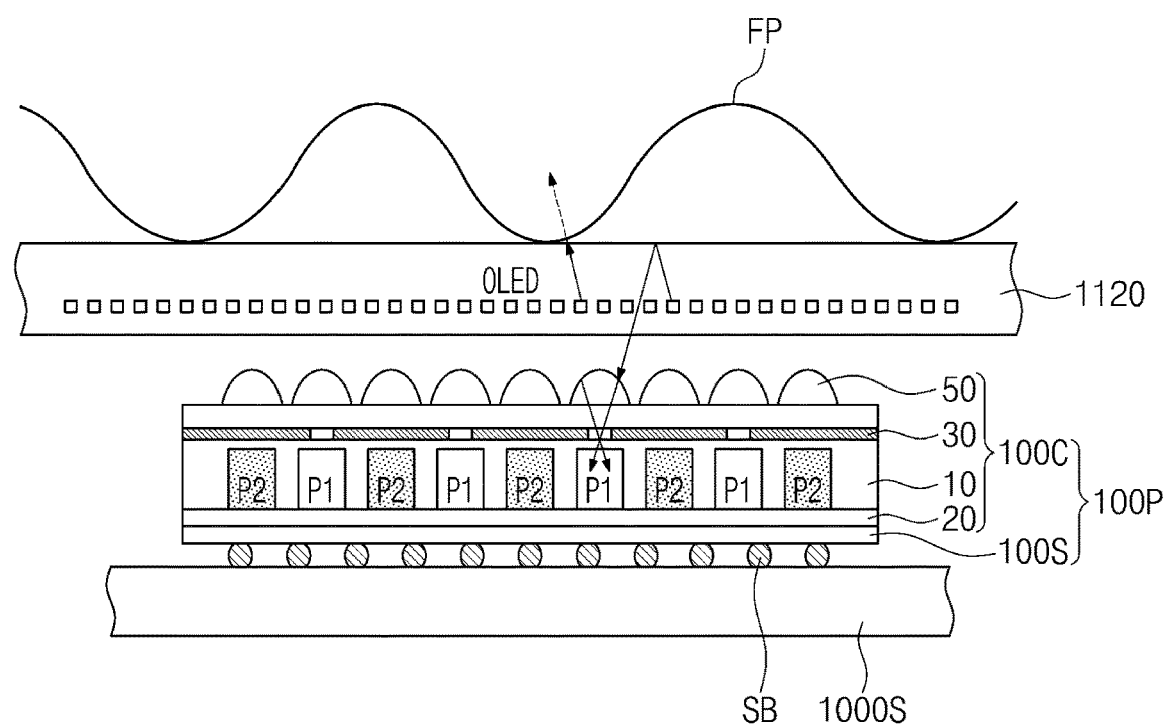
FIG. 21 illustrates a cross-sectional view showing in more detail the electronic device shown in FIG. 20.

FIG. 20 illustrates a cross-sectional view showing an electronic device including an image sensor according to some example embodiments of the present inventive concepts. FIG. 21 illustrates a cross-sectional view showing in more detail the electronic device shown in FIG. 20.

Referring to FIGS. 20 and 21, an electronic device 1000 may include a display panel 1120, an image sensor package 100P, and a board 1000S.

The display panel 1120 may be an organic light emitting diode (OLED) display panel including an OLED that displays an image by emitting light having one or a plurality of colors. The present inventive concepts however are not limited thereto, and thus various type display panels such as LCD display panels may be adopted as the display panel 1120.

The image sensor package 100P may include a package substrate 100S and an image sensor 100C mounted on the package substrate 100S. An adhesive 150 may be provided to hold the image sensor package 100P to a location below the display panel 1120.

The package substrate 100S may be a printed circuit board (PCB), and a plurality of solder balls SB may be attached to a bottom surface of the package substrate 100S. The package substrate 100S may be provided on its top surface with connection pads electrically connected to the solder balls SB. The connection pads of the package substrate 100S may be electrically connected through through-vias to a readout circuit layer 20 of the image sensor 100C. In such configuration, electrical signals output from the image sensor 100C on which light is incident may be transferred through the solder balls SB to other external devices (e.g., a main processor).

The image sensor 100C may include, as discussed above, a plurality of sensing pixels P1 and a plurality of reference pixels P2. A micro-lens array 50 may receive light reflected from a fingerprint FP, and then the light may be incident on the sensing pixels P1 after passing through apertures of a light shield layer 30.

The sensing pixels P1 may sense light reflected from different areas of the fingerprint FP, and may output electrical signals corresponding to the sensed light. The sensing pixels P1 may generate electrical signals corresponding to light reflected from a ridge of the fingerprint FP or from a valley between the ridges. Amount of light sensed by a photoelectric conversion element may be changed based on a shape of the fingerprint FP from which the light is reflected, and electrical signals may be generated to have different levels in accordance with amount of the sensed light. For example, electrical signals output from the sensing pixels P1 may include brightness information (or image information), and based on the electrical signals output from the sensing pixels P1 and the reference pixels P2, a signal processing may be performed to determine whether or not locations corresponding to the sensing pixels P1 are ridges or valleys, with the result that an overall fingerprint image may be obtained by combination of the determined information.

The board 1000S may correspond to a mother board such as a printed circuit board (PCB) used for a smart phone, and the image sensor package 100P may be mounted on the board 1000S to constitute a chip-on-board type package.

Image data may be provided to the board 1000S through connection terminals formed on one surface of the image sensor package 100P. For example, the image data may be provided to the board 1000S through the solder balls SB attached to the bottom surface of the package substrate 100S.

According to some example embodiments of the present inventive concepts, because the number of reference pixels generating reference signals is increased, it may be possible to provide more accurate reference signals when processing electrical signals output from sensing pixels in proportion to incident light. In addition, because the reference pixels and the sensing pixels are disposed together on a pixel array region, it may be possible to decrease size of an image sensor.

Furthermore, the image sensor may be equipped on an electronic device, and then may perform a fingerprint detection function to provide service for authenticated users. The compactness of the image sensor may reduce an area occupied by the image sensor in the electronic device.

Although the present invention has been described in connection with some example embodiments of the present inventive concepts illustrated in the accompanying drawings, it will be understood to those skilled in the art that various changes and modifications may be made without departing from the technical spirit and essential feature of the present inventive concepts. It will be apparent to those skilled in the art that various substitution, modifications, and changes may be thereto without departing from the scope and spirit of the inventive concepts.

What is claimed is:

1. An image sensor comprising:
   a substrate having a first surface and a second surface opposite to the first surface;
   a first photoelectric conversion region and a second photoelectric conversion region in the substrate;
   a first layer including a first opening and a second opening, the first layer being disposed to cover the second surface;
   a second layer including a third opening and a fourth opening, the second layer being disposed on the first layer;
   a planarization layer disposed on the second layer; and
   a first lens corresponding to the first photoelectric conversion region and a second lens corresponding to the second photoelectric conversion region,
   wherein the first opening is vertically aligned with the third opening and the second opening is vertically aligned with the fourth opening,
   wherein the first opening is vertically aligned with a central portion of the first photoelectric conversion region, and
   wherein the third opening is at least as wide as the first opening in a first direction.

2. The image sensor of claim 1, wherein the first opening and the second opening are arranged in the first direction and the third opening and the fourth opening are arranged in the first direction, and
   wherein a width of the third opening in the first direction is greater than a width of the first opening in the first direction.

3. The image sensor of claim 2, wherein the first opening has a first height in a second direction perpendicular to the first direction and the third opening has a second height in the second direction, and
   wherein the second height is greater than the first height.

4. The image sensor of claim 3, further comprising a third photoelectric conversion region between the first photoelectric conversion region and the second photoelectric conversion region, and
   wherein the third photoelectric conversion region is covered by the first layer.

5. The image sensor of claim 1, wherein the first opening and the second opening are arranged in the first direction and the third opening and the fourth opening are arranged in the first direction.

6. The image sensor of claim 1, wherein the first layer has a first thickness and the second layer has a second thickness which is greater than the first thickness.

7. An image sensor comprising:
   a substrate having a first surface and a second surface opposite to the first surface;
   a first photoelectric conversion region and a second photoelectric conversion region in the substrate;
   a first layer including a first opening and a second opening, the first layer being disposed to cover the second surface;
   a second layer disposed on the first layer, and including a third opening and a fourth opening;

a third layer disposed on the second layer, and including a fifth opening and a sixth opening;

a planarization layer disposed on the third layer; and a first lens corresponding to the first photoelectric conversion region and a second lens corresponding to the second photoelectric conversion region, wherein the first opening is vertically aligned with a central portion of the first photoelectric conversion region and the second opening is vertically aligned with a central portion of the second photoelectric conversion region, wherein a distance between the first photoelectric conversion region and the second photoelectric conversion region in a first direction is greater than a width of the first opening in the first direction, wherein the first opening is vertically aligned with the third opening and the fifth opening, and wherein the second opening is vertically aligned with the fourth opening and the sixth opening.

8. The image sensor of claim 7, wherein the first opening has a circular shape.

9. The image sensor of claim 8, wherein the first layer has a first thickness in a second direction perpendicular to the first direction and the second layer has a second thickness in the second direction, and wherein the second thickness is greater than the first thickness.

10. The image sensor of claim 9, wherein the third layer has a third thickness in the second direction and the second thickness is greater than the third thickness.

11. The image sensor of claim 10, further comprising a fourth layer between the second layer and the third layer.

12. The image sensor of claim 10, wherein a width of the fifth opening in the first direction is greater than the width of the first opening in the first direction.

13. The image sensor of claim 10, further comprising a third photoelectric conversion region between the first photoelectric conversion region and the second photoelectric conversion region, and wherein the third photoelectric conversion region is covered by the first layer.

14. An image sensor comprising:

a substrate having a first surface and a second surface opposite to the first surface;

a first photoelectric conversion region and a second photoelectric conversion region in the substrate;

a first layer including a first opening and a second opening, the first layer being disposed to cover the second surface;

a second layer disposed on the first layer;

a third layer disposed on the second layer;

a planarization layer disposed on the third layer; and a first lens corresponding to the first photoelectric conversion region and a second lens corresponding to the second photoelectric conversion region, wherein the first opening is vertically aligned with a central portion of the first photoelectric conversion region and the second opening is vertically aligned with a central portion of the second photoelectric conversion region, wherein a distance between the first photoelectric conversion region and the second photoelectric conversion region in a first direction is greater than a width of the first opening in the first direction, wherein the first layer has a first thickness in a second direction perpendicular to the first direction and the second layer has a second thickness in the second direction, and wherein the second thickness is greater than the first thickness.

* * * * *